(12) United States Patent
Nakibly et al.

(10) Patent No.: US 11,936,393 B1
(45) Date of Patent: Mar. 19, 2024

(54) COOPERATIVE TIMING ALIGNMENT USING SYNCHRONIZATION PULSES

(71) Applicant: Amazon Technologies, Inc., Seattle, WA (US)

(72) Inventors: Guy Nakibly, Kedumim (IL); Moshe Raz, Pardesiya (IL); Zvika Glaubach, Tel Aviv-Jaffa (IL)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 17/805,670

(22) Filed: Jun. 6, 2022

(51) Int. Cl.
| | |
|---|---|
| H03L 7/00 | (2006.01) |
| G11C 11/406 | (2006.01) |
| H03L 7/099 | (2006.01) |
| H03L 7/12 | (2006.01) |

(52) U.S. Cl.
CPC .......... H03L 7/12 (2013.01); G11C 11/40615 (2013.01); G11C 11/40618 (2013.01); H03L 7/0992 (2013.01)

(58) Field of Classification Search
CPC ... H03L 7/12; H03L 7/0992; G11C 11/40615; G11C 11/40618
USPC ......................................................... 327/141
See application file for complete search history.

(56) References Cited

U.S. PATENT DOCUMENTS

| | | | |
|---|---|---|---|
| 5,706,485 A | 1/1998 | Barkatullah et al. | |
| 7,603,541 B2 | 10/2009 | Nolan et al. | |
| 7,661,007 B2 | 2/2010 | Ho | |
| 9,720,439 B2* | 8/2017 | Tennant | G06F 1/12 |
| 10,530,562 B2* | 1/2020 | Paterson | H04J 3/0682 |
| 10,691,576 B1* | 6/2020 | Shapira | G06F 11/2221 |
| 10,763,829 B2* | 9/2020 | Crawford | H03K 9/06 |
| 11,586,443 B2 | 2/2023 | Baronne et al. | |
| 2017/0168520 A1* | 6/2017 | Yu | G06F 1/14 |
| 2022/0019548 A1 | 1/2022 | Graif et al. | |
| 2022/0121557 A1 | 4/2022 | Golla et al. | |
| 2023/0046542 A1 | 2/2023 | Narala et al. | |

OTHER PUBLICATIONS

U.S. Appl. No. 17/805,671, inventors Nakibly et al., filed Jun. 6, 2022.
U.S. Appl. No. 17/805,672, inventors Nakibly et al., filed Jun. 6, 2022.
U.S. Non-Final Office Action dated Nov. 24, 2023 in U.S. Appl. No. 17/805,672.

* cited by examiner

*Primary Examiner* — Ryan Jager
(74) *Attorney, Agent, or Firm* — Weaver Austin Villeneuve & Sampson LLP

(57) ABSTRACT

Techniques for cooperative timing alignment using synchronization pulses are described. The techniques can include generating, at an integrated circuit device, a timing signal, controlling a local count value based on the timing signal, monitoring a synchronization signal of a system comprising the integrated circuit device, detecting a synchronization pulse in the synchronization signal, and aligning the local count value with an implied count value associated with the synchronization pulse in order to align the local count value with those of other integrated circuit devices of the system.

18 Claims, 16 Drawing Sheets

COOPERATIVE TIMING ALIGNMENT USING SYNCHRONIZATION PULSES

BACKGROUND

A computing system can include multiple integrated circuit devices ("chips"), each of which can keep track of time using a respective system count. Each chip can comprise a signal generator that generates a local timing signal, and a count controller that controls the system count at that chip based on the local timing signal. Each chip can expose its local system count to software executing on the computing system.

BRIEF DESCRIPTION OF THE DRAWINGS

Various embodiments in accordance with the present disclosure will be described with reference to the drawings, in which.

DETAILED DESCRIPTION

In a multi-chip system, there can be slight variations in the count frequencies achieved at different chips. Although the chips may all be designed to operate at a common count frequency, some chips may operate at slightly above that count frequency, and others may operate slightly below it. Over time, this can cause the system counts of the chips to drift apart over time. Mismatches among the system counts of the various chips can create problems for software executing on the computing system.

Disclosed herein are cooperative timing alignment techniques that can be used to align the system counts of different chips in a computing system. According to various implementations, a synchronization signal can be generated for use by chips of the computing system to align their system counts. The synchronization signal can comprise synchronization pulses and can be generated by a pulse generator, which can be external to all of the chips or can be comprised in one of the chips. The chips can identify system counts implied by the synchronization pulses according to a predefined scheme, and set their system counts to match those implied system counts. By doing so, the chips can mutually align their system timings.

In the following description, various examples will be described. For purposes of explanation, specific configurations and details are set forth in order to provide a thorough understanding of the examples. However, it will also be apparent to one skilled in the art that the example may be practiced without the specific details. Furthermore, well-known features may be omitted or simplified in order not to obscure the embodiments being described.

Figure 1:
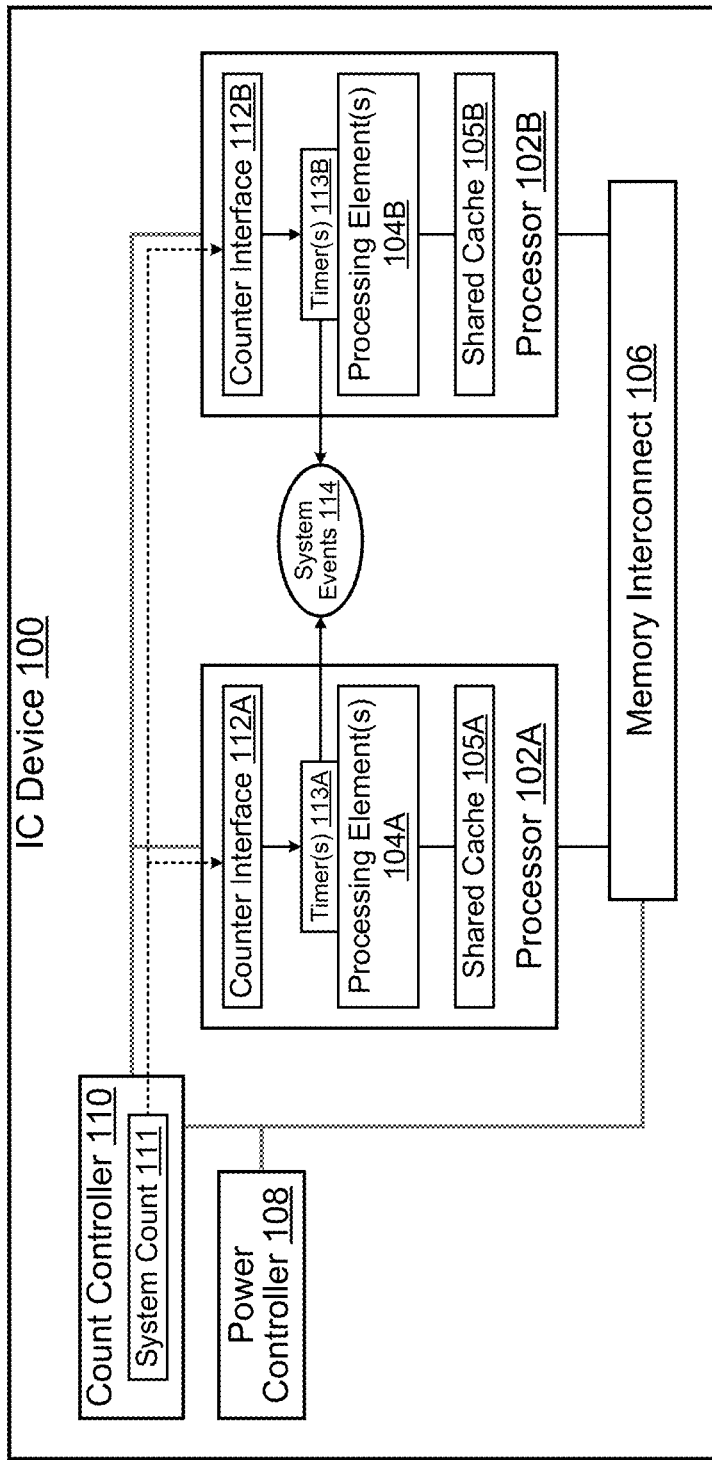
FIG. 1 is a block diagram of a first example integrated circuit device.

FIG. 1 is a block diagram of an example integrated circuit device 100 with respect to which a system count 111 serves as a timing reference for operations performed thereon. As shown in FIG. 1, integrated circuit device 100 can include processors 102A and 102B, memory interconnect 106, power controller 108, and count controller 110. In some implementations, integrated circuit device 100 can be a microchip ("chip"), such as a system-on-a-chip (SoC). It is to be appreciated that in some implementations, integrated circuit device 100 can include other component(s) in addition to—or in lieu of—component(s) depicted in FIG. 1.

Processors 102A and 102B respectively include processing element(s) 104A and processing element(s) 104B, and shared caches 105A and 105B. Processing element(s) 104A and 104B can use respective shared caches 105A and 105B for fast storage and retrieval of data during processing operations. In some implementations, processors 102A and 102B can be multiprocessors (e.g., multi-core processors), and can include multiple respective processing elements 104A and 104B. In some other implementations, processors 102A and 102B can include single respective processing elements 104A and 104B. It is worthy of note that processors 102A and 102B need not necessarily be the same. Thus, for instance, in some implementations, processor 102A can be a multiprocessor including multiple processing elements 104A, while processor 102B can include just a single processing element 104B. Furthermore, in some implementations, integrated circuit device 100 can include more than two processors, or can include just a single processor (which in turn could include multiple processing elements or just a single processing element).

Memory interconnect 106 can provide connectivity to memory external to integrated circuit device 100. For example, memory interconnect 106 can provide connectivity to memory in external dynamic random access memory (DRAM) via a memory bus. In some implementations, memory interconnect 106 can include a memory controller, which can manage the communication of data to/from external memory via such a memory bus. Power controller 108 can control the delivery of electric power to components of integrated circuit device 100, such as any or all of processors 102A and 102B, memory interconnect 106, and count controller 110. In some implementations, power controller 108 can be connected with count controller 110 and memory interconnect 106 by an advanced peripheral bus (APB).

Count controller 110 maintains the system count 111 of integrated circuit device 100 for use as a timing reference by components of integrated circuit device 100, such as processors 102A and 102B. In some implementations, system count 111 can be a 64-bit counter value. Count controller 110 can be designed to increment system count 111 at a given count frequency $F_C$, such that the value of system count 111 increases at the rate of $F_C$ per second. In some implementations, count controller 110 can include a phase-locked loop (PLL), which can accept a lower-frequency reference signal and frequency-multiply it to produce a higher-frequency output signal. The actual count frequency that count controller 110 realizes may not necessarily be precisely equal to the intended count frequency $F_C$. Rather, with respect to a given implementation of integrated circuit device 100, the actual count frequency of the output signal will typically be close to—but slightly higher or lower than—the intended count frequency $F_C$.

Count controller 110 can provide system count 111 to respective counter interfaces 112A and 112B of processors 102A and 102B. In some implementations, count controller 110 can provide system count 111 to counter interfaces 112A and 112B via a system timer bus. Processors 102A and 102B can use system count 111 to implement timer(s) 113A and 113B that control various operations of processing element (s) 104A and 104B, respectively. For instance, timer(s) 113A and 113B can control the timing according to which processing element(s) 104A and 104B generate and/or react to system events 114.

Figure 2:
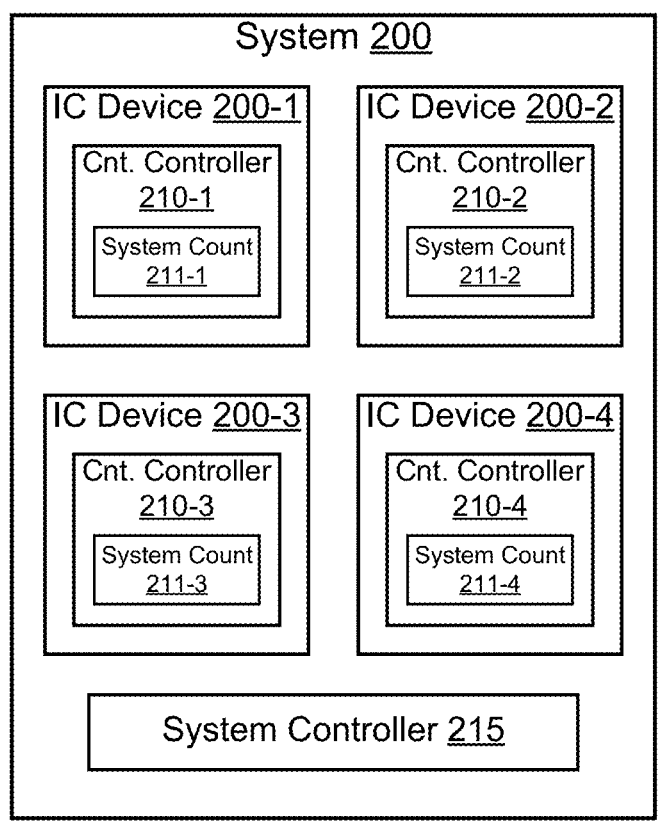
FIG. 2. is a block diagram of a first example system.

FIG. 2 is a block diagram of an example system 200 including multiple integrated circuit devices 200-1, 200-2, 200-3, and 200-4, which can have similar and/or different architectures/functionalities. Any of integrated circuit devices 200-1 to 200-4 can be the same as—or similar to—integrated circuit device 100 of FIG. 1. For example, according to some implementations, integrated circuit device 100 of FIG. 1 can be a chip, and system 200 can include four such chips. Integrated circuit devices 200-1, 200-2, 200-3, and 200-4 include respective count controllers 210-1, 210-2, 210-3, and 210-4, which provide respective system counts 211-1, 211-2, 211-3, and 211-4 for use as timing references by components of integrated circuit devices 200-1, 200-2, 200-3, and 200-4. It is to be appreciated that although system 200 includes four integrated circuit devices 200-1, 200-2, 200-3, and 200-4 in the depicted example, system 200 can include lesser or greater numbers of such devices in various implementations.

System 200 also includes system controller 215. System controller 215 can generally manage/control components of system 200 to support normal operation of system 200. As part of its management/control role, system controller 215 can coordinate the use of processing capabilities of integrated circuit devices 210-1, 210-2, 210-3, and 210-4 to perform various processing tasks. In conjunction with this coordination, system controller 215 can refer to the system counts 211-1, 211-2, 211-3, and 211-4 of integrated circuit devices 200-1, 200-2, 200-3, and 200-4 when determining timings for processing tasks assigned to integrated circuit devices 200-1, 200-2, 200-3, and 200-4. In some implementations, system controller 215 can be implemented in software. In some other implementations, system controller 215 can be implemented using a combination of software and hardware, or a combination of software, hardware, and firmware. In yet other implementations, system controller 215 can be implemented as hardware and/or firmware.

System counts 211-1, 211-2, 211-3, and 211-4 can each be of a same size (e.g., 64-bits), and count controllers 210-1, 210-2, 210-3, and 210-4 can each be designed to increment their respective system counts at the same count frequency $F_C$. If count controllers 210-1 to 210-4 exhibit ideal behavior—such that they each increment their respective system counts at exactly count frequency $F_C$—then the values of system counts 211-1 to 211-4 can be expected to match each other in lock-step over time.

However, in practice, it may be difficult to achieve such ideal behavior. As discussed above, rather than exactly matching count frequency $F_C$, count controllers 210-1 to 210-4 may yield count frequencies slightly less than or greater than $F_C$. These count frequencies may differ slightly from each other as well, and may potentially include both count frequencies slightly less than $F_C$ and count frequencies slightly greater than $F_C$. Such frequency variances, however slight, can cause the values of system counts 211-1 to 211-4 to drift apart over time.

Figure 3:
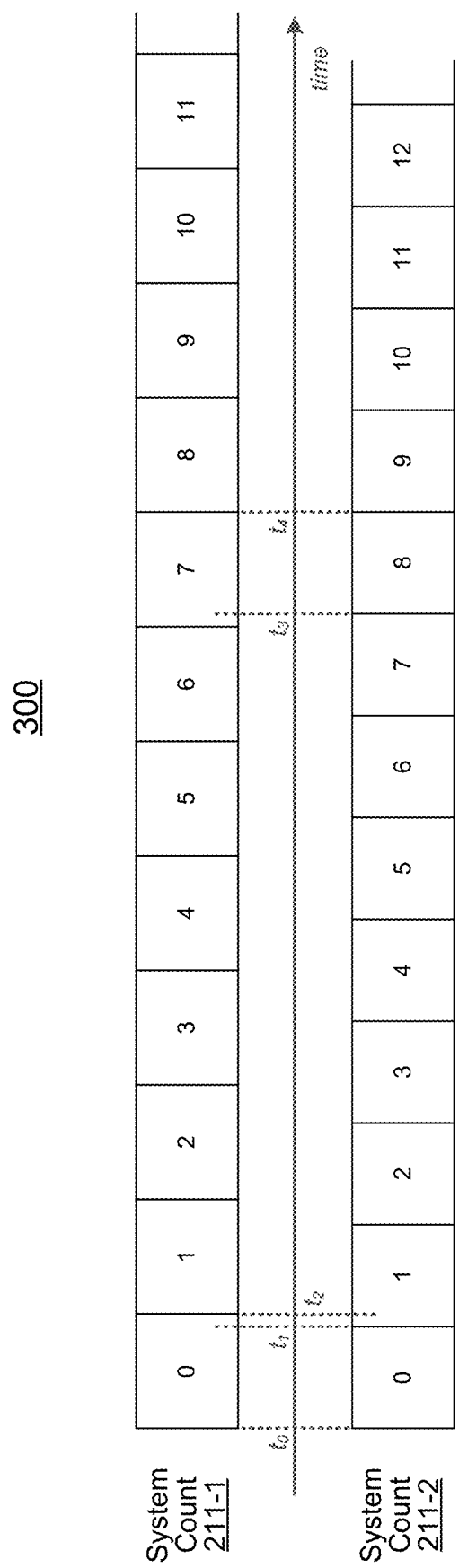
FIG. 3 is a first example timing diagram.

FIG. 3 is a timing diagram 300 that illustrates an example of counter value drift.

Depicted in the timing diagram are exemplary timings according to which system counts 211-1 and 211-2 may be incremented by count controllers 210-1 and 210-2 of FIG. 2. Above a time axis, the exemplary behavior of system count 211-1 is illustrated using a series of blocks, which represent successive counter values (0, 1, 2, etc.). The exemplary behavior of system count 211-2 is likewise illustrated below the time axis. The depicted example reflects a scenario in which the count frequency of system count 211-2 is slightly greater than the count frequency of system count 211-1.

System counts 211-1 and 211-2 are initialized to 0 at a same time to. However, since the respective count frequencies of system counts 211-1 and 211-2 are different, they are incremented to 1 at different times. System count 211-2, having a slightly greater count frequency, is incremented to 1 at time $t_1$. System count 211-1, having a slightly lesser count frequency, is not incremented to 1 until a slightly later time $t_2$. By the time $t_3$ at which system count 211-2 reaches 8, system count 211-1 is almost a full count behind, having only reached 7 just slightly before time $t_3$. System count 211-1 lags system count 211-2 by a full count as of time $t_4$, and this lag will only grow with the passage of additional time. Such mismatches among system counts 211-1, 211-2, 211-3, and 211-4 can be problematic for system controller 215 of device 200 as it coordinates operations of integrated circuit devices 200-1, 200-2, 200-3, and 200-4.

Figure 4:
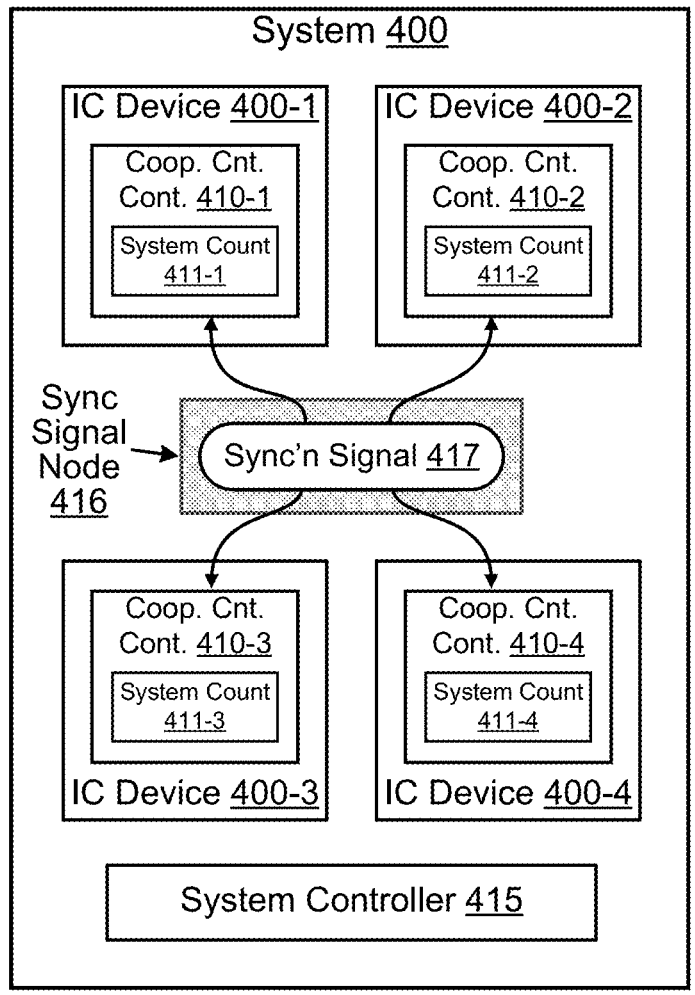
FIG. 4 is a block diagram of a second example system.

FIG. 4 is a block diagram of an example system 400 that may be representative of the disclosed cooperative timing alignment techniques according to various implementations. System 400 includes multiple integrated circuit devices 400-1, 400-2, 400-3, and 400-4. Integrated circuit devices 400-1 to 400-4 can be similar to integrated circuit device 100 of FIG. 1 and/or integrated circuit devices 200-1 to 200-4 of FIG. 2. It is to be appreciated that although system 400 includes four integrated circuit devices 400-1 to 400-4 in the depicted example, system 400 can include lesser or greater numbers of such devices in various implementations.

Integrated circuit devices 400-1, 400-2, 400-3, and 400-4 comprise respective cooperative count controllers 410-1, 410-2, 410-3, and 410-4. Analogously to count controllers 210-1 to 210-4 of integrated circuit devices 200-1 to 200-4, cooperative count controllers 410-1, 410-2, 410-3, and 410-4 provide respective system counts 411-1, 411-2, 411-3, and 411-4 for use as timing references by components of integrated circuit devices 400-1, 400-2, 400-3, and 400-4. System counts 411-1, 411-2, 411-3, and 411-4 can each be of a same size (e.g., 64-bits), and cooperative count controllers 410-1, 410-2, 410-3, and 410-4 can each be designed to increment their respective system counts at the same count frequency $F_C$.

System 400 also includes system controller 415. System controller 415 can generally manage/control components of system 400 to support normal operation of system 400. As part of its management/control role, system controller 415 can coordinate the use of processing capabilities of integrated circuit devices 410-1, 410-2, 410-3, and 410-4 to perform various processing tasks. In conjunction with this coordination, system controller 415 can refer to the system counts 411-1, 411-2, 411-3, and 411-4 of integrated circuit devices 400-1, 400-2, 400-3, and 400-4 when determining timings for processing tasks assigned to integrated circuit devices 400-1, 400-2, 400-3, and 400-4. In some implementations, system controller 415 can be implemented in software. In some implementations, system controller 415 can be implemented using a combination of software and one or both of hardware and firmware. In some implementations, system controller 415 can be implemented entirely using hardware and/or firmware.

In system 400, a synchronization signal 417 is provided to the cooperative count controllers 410-1 to 410-4 of integrated circuit devices 400-1 to 400-4. Synchronization signal 417 can serve as a common reference signal to enable alignment of the timings/system counts of integrated circuit devices 400-1 to 400-4. Synchronization signal 417 can be a pulse signal comprising pulses transmitted at a pulse frequency $F_P$ that is a fraction of the count frequency $F_C$ of cooperative count controllers 410-1 to 410-4, such that system counts 411-1 to 411-4 are incremented multiple times between any two successive pulses. A number $I_P$ of system count incrementations occurring between successive pulses at a cooperative count controller operating at the intended count frequency $F_C$ can be determined according to Equation (1) as follows:

$$I_P = F_C/F_P \quad (1)$$

Thus, for example, if the count frequency $F_C$ is 1 GHz, and the pulse frequency $F_P$ is 1 MHz, the number $I_P$ of system count incrementations between successive pulses is equal to 1000.

Cooperative count controllers 410-1 to 410-4 can use knowledge of the ratio between the count frequency $F_C$ and the pulse frequency $F_P$—in other words, the value of $I_P$—to bring their actual count frequencies into alignment with the intended count frequency $F_C$, and thus align their system counts with each other. On startup, cooperative count controllers 410-1 to 410-4 can initialize their system counts. This can involve setting those system counts to a same predesignated initial value, such as zero. Cooperative count controllers 410-1 to 410-4 can then begin counting. Thereafter, each time they detect a pulse in synchronization signal 417, they can (if necessary) adjust their system counts to match the value implied by that pulse.

The system count value implied by an $i^{th}$ pulse in synchronization signal 417 can be determined according to Equation (2) as follows:

$$V(i) = V(i-1) + I_P; \ i > 1$$

$$V(i) = I_P; \ i = 1 \quad (2)$$

where $V(i)$ represents the system count value implied by the $i^{th}$ pulse and $V(i-1)$ represents the system count value implied by the pulse that immediately precedes the $i^{th}$ pulse. In some implementations, cooperative count controllers 410-1 to 410-4 can determine the system count values implied by pulses in synchronization signal 417 based on this recursive relationship.

The first pulse in synchronization signal 417, occurring 1/Fr seconds after startup, implies a system count of $I_P$. Upon detection of this first pulse, cooperative count controllers 410-1 to 410-4 can adjust their system counts to match that implied count value. Cooperative count controllers 410-1 to 410-4 can determine the system count implied by any particular subsequent pulse $P_n$ by adding the value $I_P$ to the system count implied by the preceding pulse $P_{n-1}$, and can adjust their system counts accordingly. For instance, upon detecting the second pulse in synchronization signal 417, cooperative count controllers 410-1 to 410-4 can determine an implied system count of $I_P + I_P$, and can adjust their system counts to match. In this manner, system counts 411-1 to 411-4 can be realigned with each other upon each pulse in synchronization signal 417.

As shown in FIG. 4, synchronization signal 417 can be transmitted from a synchronization signal node 416. Synchronization signal node 416 represents a substantially central point from which synchronization signal 417 can be simultaneously transmitted to each of cooperative count controllers 410-1 to 410-4. In some implementations, synchronization signal 417 can be generated (e.g., by a pulse generator) at synchronization signal node 416. In other implementations, synchronization signal 417 can be generated at a different point/position and passed to synchronization signal node 416, from where it can then be routed simultaneously to each of cooperative count controllers 410-1 to 410-4.

Figure 5:
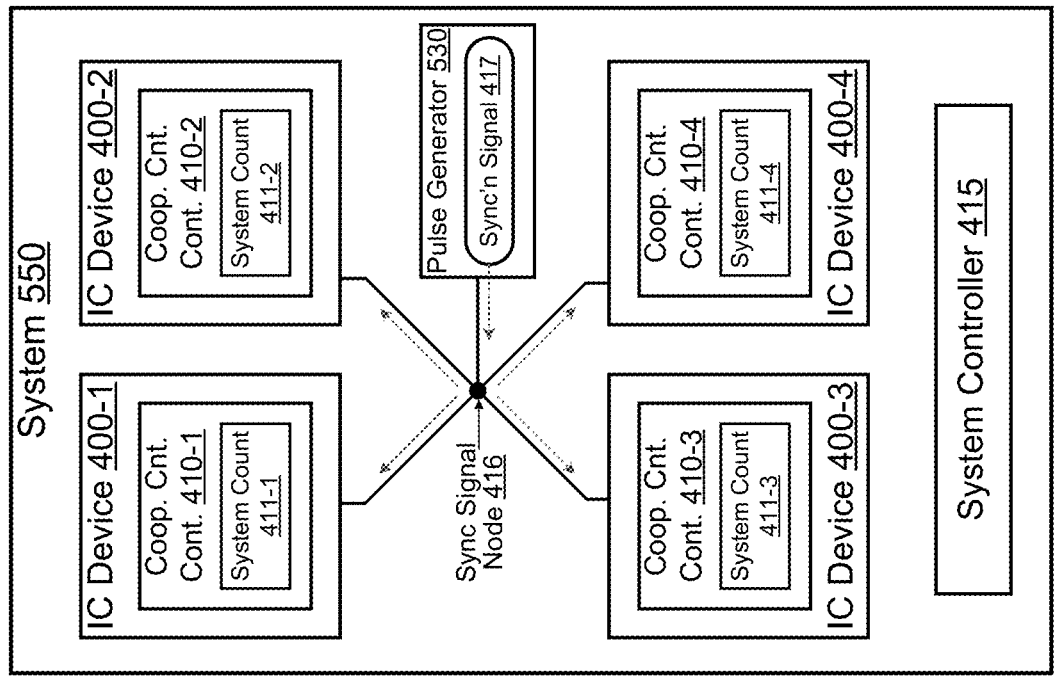
FIG. 5 includes a block diagram of a third example system and a block diagram of a fourth example system.
Figure 5:
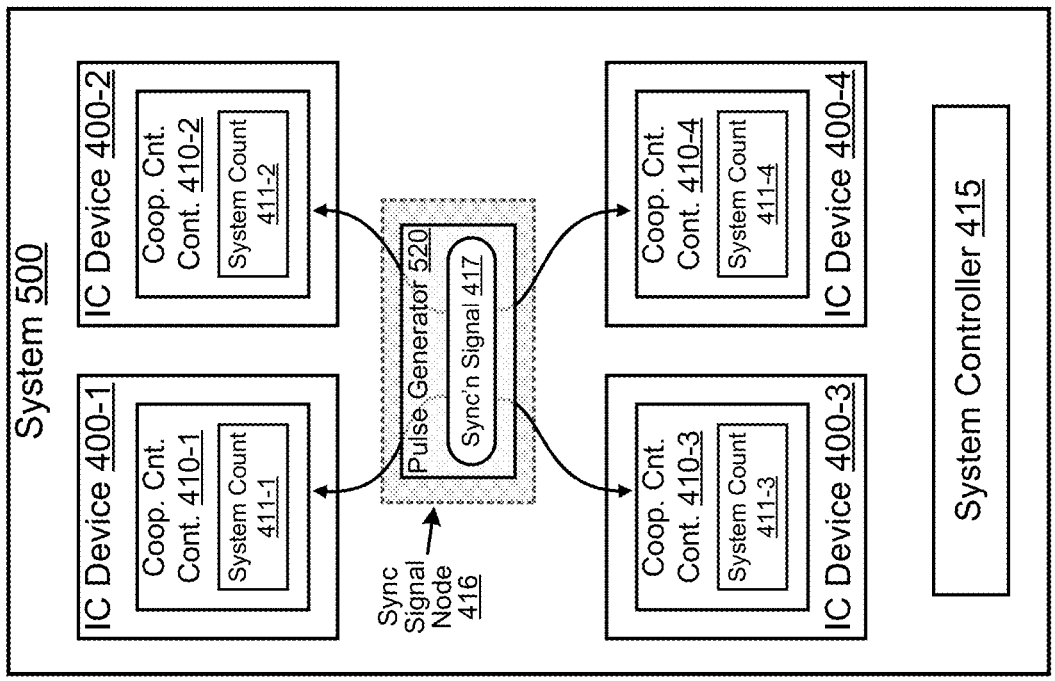

FIG. 5 illustrates a block diagram of a system 500 that may be representative of some implementations of system 400 of FIG. 4. In system 500, synchronization signal 417 is generated at synchronization signal node 416. More particularly, synchronization signal 417 is generated by a pulse generator 520 located at synchronization signal node 416, and passes directly from pulse generator 520 to integrated circuit devices 400-1 to 400-4.

FIG. 5 also illustrates a block diagram of a system 550, which may be representative of other implementations of system 400 of FIG. 4. In system 550, synchronization signal 417 is not generated at synchronization signal node 416. Rather, it is generated at a different point/position by a pulse generator 530 and passed to synchronization signal node 416, from which it is simultaneously routed to each of integrated circuit devices 400-1 to 400-4. In some implementations, synchronization signal node 416 can be a point to which cooperative count controllers 410-1 to 410-4 are connected according to a star topology.

Figure 6:
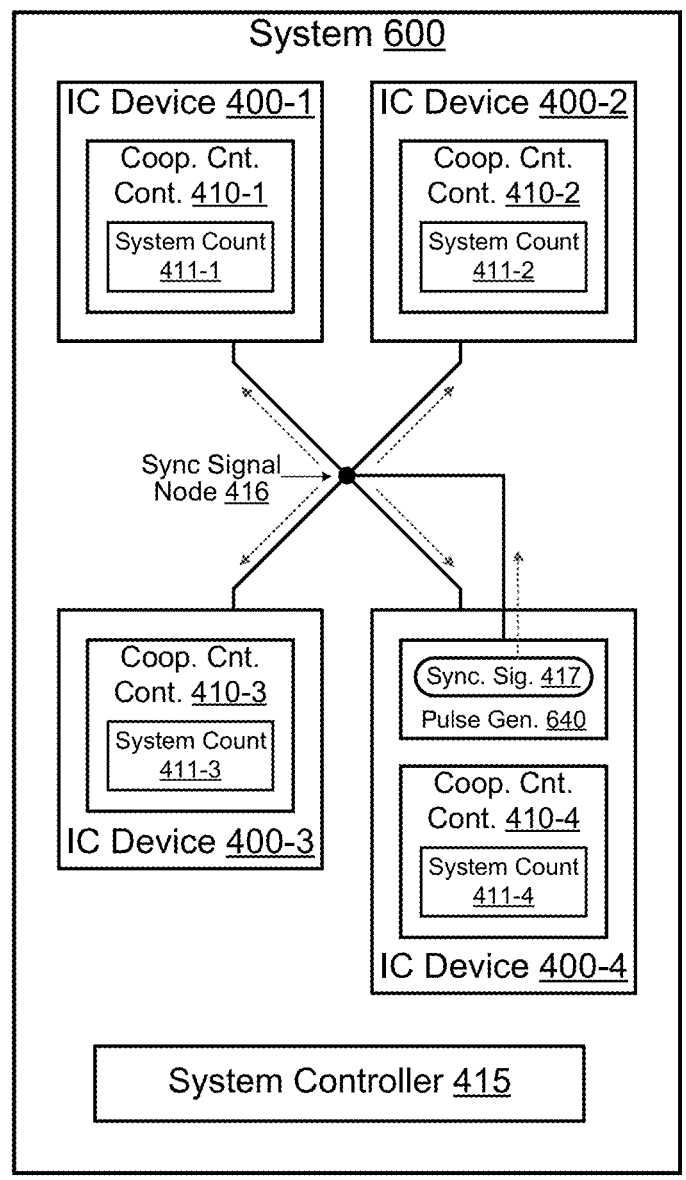
FIG. 6 includes a block diagram of a fifth example system.

FIG. 6 illustrates a block diagram of a system 600 that may be representative of some implementations of system 400 of FIG. 4. In system 600, rather than being passed to synchronization signal node 416 by a pulse generator external to integrated circuit devices 400-1, 400-2, 400-3, and 400-4, synchronization signal 417 is generated by a pulse generator 640 comprised in integrated circuit device 400-4. Synchronization signal 417 passes from pulse generator 640 to synchronization signal node 416, from which it is simultaneously routed to each of integrated circuit devices 400-1 to 400-4. In some implementations of system 600, like some implementations of system 550 of FIG. 5, synchronization signal node 416 can be a point to which cooperative count controllers 410-1 to 410-4 are connected according to a star topology.

In some implementations, pulse generator 640 can be implemented using pulse generation capabilities of integrated circuit device 400-4. In some implementations, these pulse generation capabilities can be provided using a same PLL as is used to generate system count 411-4. In some implementations, pulse generator 640 can be capable of generating a pulse signal with a configurable pulse frequency, and this capability can be used to generate synchronization signal 417 with the desired pulse frequency $F_P$. In some implementations, a duty cycle of the pulse signal can also be configurable, and the duty cycle can be configured so that pulses in synchronization signal 417 are long enough to be detected by cooperative count controllers 410-1 to 410-4.

Figure 7:
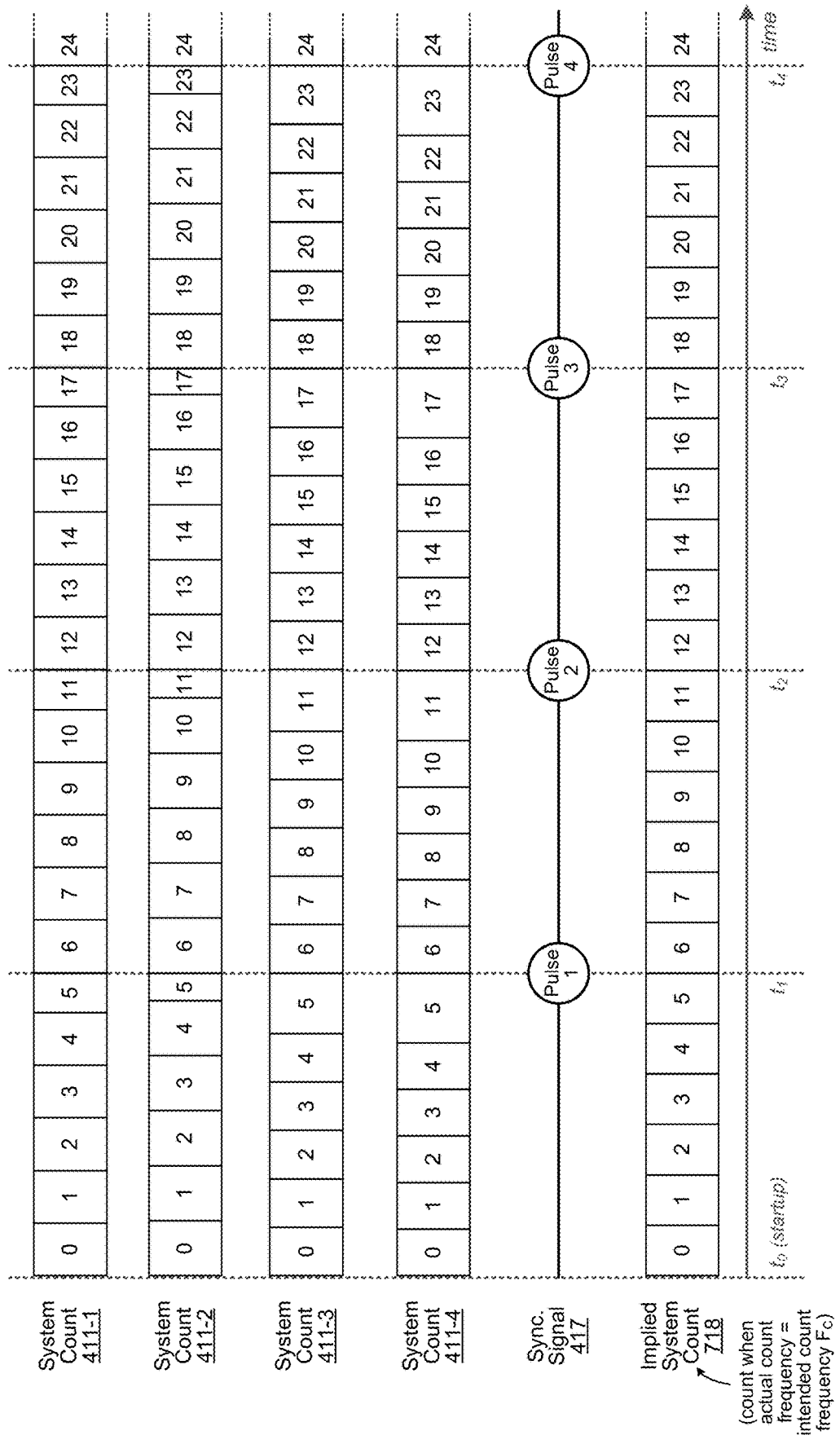
FIG. 7 is a second example timing diagram.

FIG. 7 is a timing diagram 700 that illustrates an example of synchronization signal 417 being used to align system counts 411-1 to 411-4. Shown in timing diagram 700 is an implied system count 718, which corresponds to a count for which the actual count frequency is equal to the intended count frequency $F_C$. Implied system count 718 can serve as a common count with which devices in system 400 (e.g., integrated circuit devices 400-1 to 400-4) can align their respective local counts (e.g., system counts 411-1 to 411-4), and thereby synchronize with each other. Such devices can determine the value (of implied system count 718) implied by synchronization pulses in synchronization signal 417 based on the counts-per-pulse value $I_P$ discussed above.

In the depicted example, the value of $I_P$ is 6, and thus implied system count 718 is incremented six times between any two consecutive pulses in synchronization signal 417. System counts 411-1 and 411-2 are both incremented according to count frequencies that are slightly less than $F_C$. In order to align with implied system count 718, system counts 411-1 and 411-2 jump to values 6, 12, 18, and 24 at times $t_1$, $t_2$, $t_3$, and $t_4$ (in response to pulses 1, 2, 3, and 4), and are thus incremented to those values earlier than they otherwise would be. System counts 411-3 and 411-4 are both incremented according to count frequencies that are slightly greater than $F_C$. In order to align with implied system count 718, system counts 411-3 and 411-4 defer incrementing to values 6, 12, 18, and 24 until times $t_1$, $t_2$, $t_3$, and $t_4$ (in response to pulses 1, 2, 3, and 4), and are thus incremented to those values later than they otherwise would be.

Figure 8:
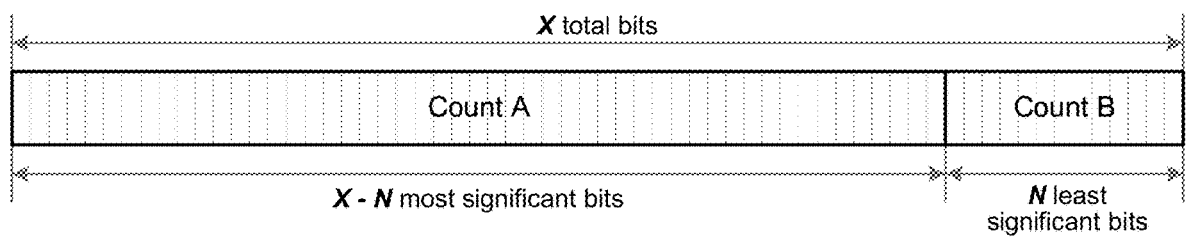
FIG. 8 illustrates an example of a system count.

In some implementations, the system counts 411-1 to 411-4 generated by cooperative count controllers 410-1 to 410-4 of system 400 can each be logically subdivided into two counts to facilitate synching with the implied system account upon detection of pulses in synchronization signal 417. FIG. 8 is a block diagram of an example system count 800 that may be representative of any of system counts 411-1 to 411-4 according to such an implementation.

System count 800, which comprises X total bits, is logically divided into a count A and a count B. Count B is indicated by the N least significant bits of system count 800. Count A is indicated by the remaining X-N most significant bits of system count 800. According to some implementations, the value of X may be 64, and the value of N may be 13. In such implementations, the first 51 bits of system count 800 comprise count A, and the last 13 bits of system count 800 comprise count B.

In some implementations, for a given count frequency $F_C$ and specified number N of bits in count B, the pulse frequency $F_P$ can be selected by dividing the count frequency by the number $2^N$ of possible values of counter B. For example, if count B comprises 3 bits—and thus has 8 possible values—the pulse frequency $F_P$ can be selected as $F_C/8$. Similarly, in some implementations, for a given count frequency $F_C$ and a given pulse frequency $F_P$, the number N of bits in count B can be selected such that the number $2^N$ of possible values of count B matches the ratio between the count frequency $F_C$ and the pulse frequency $F_P$. For example, if the count frequency $F_C$ is 32 MHz and the pulse frequency $F_P$ is 250 kHz, and thus $F_C/F_P$ equals 128, then a size of 7 bits can be selected for count B, so that it has 128 possible values.

During the intervals between pulses in the synchronization signal, count B can be incremented until either a pulse is detected or count B reaches its maximum possible value (such that each of its bits is a '1'), whichever occurs earlier. Each time a pulse is detected, count B can be reset to 0, and count A can be incremented by 1. By resetting count B and incrementing count A upon detection of each pulse, a cooperative count controller generating system count 800 can repeatedly realign the system timing of its integrated circuit device with those of other integrated circuit devices at which other cooperative count controllers are performing the same procedure based on the same synchronization signal.

Returning to FIG. 4, in some implementations, system counts 410-1 to 410-4 can each be logically subdivided into respective pairs of counts A and B as discussed above in reference to system count 800 of FIG. 8. In some such implementations, for a given count frequency $F_C$, the pulse frequency $F_P$ can be selected to achieve a value of $I_P$ that satisfies particular constraint(s) designed to prevent system controller 415 from seeing mismatched values of system counts 411-1, 411-2, 411-3, and 411-4, as discussed above, and the number of bits used for count B can be selected to accommodate the number $I_P$ of count iterations that occur between pulses.

During the intervals between pulses in synchronization signal 417, cooperative count controllers 410-1 to 410-4 can increment their respective count Bs until either they detect a pulse in synchronization signal 417 or their respective count Bs reach the maximum possible value, whichever occurs earlier. Each time they detect a pulse in synchronization signal 417, cooperative count controllers 410-1 to 410-4 can reset their respective count Bs to 0, and increment their respective count As. By performing this procedure, cooperative count controllers 410-1 to 410-4 can repeatedly realign the system timings of integrated circuit devices 400-1 to 400-4.

In some implementations, the use of dual counts A and B, as described above, can facilitate initial system timing alignment for newly-activated integrated circuit devices of system 400. If an integrated circuit device of system 400 is newly activated while other integrated circuit devices of system 400 are already active, the system timing of the newly-activated integrated circuit device will likely not match the aligned system timings of the active devices. In some implementations, the newly-activated device can be notified, prior to an upcoming pulse in synchronization signal 417, of what the value of A will be following its incrementation upon that pulse. In some implementations, this upcoming value of A can be provided to the newly-activated device by storing it in a register of the newly-activated device, or in a register accessible by the newly-activated device. In some implementations, an already-active device in system 400 can write this A value to such a register.

At startup, a cooperative count controller of the newly-activated device can set its A value to 0, and can begin incrementing B as it would do during the intervals between pulses in synchronization signal 417. Subsequently, upon detecting a pulse in synchronization signal 417, the cooperative count controller of the newly-activated device can reset its count B to 0 and can set its count A to the value with which it was provided (e.g., by reading the value from a register and then setting its count A to match).

In some implementations, the amount of time needed to write the correct A value to a register of the newly-activated device may take too long for the write to be completed before the upcoming pulse occurs. This can be the case, for example, if the newly-activated device is activated during the latter portion of the interval between that pulse and the preceding pulse. If the amount of time needed to write to the register is greater than the amount of time between pulses, then the A value may not be available to be read from the register until the pulse with which it is associated has already occurred.

In some implementations, system controller 415 can temporarily reduce the pulse frequency $F_P$, and thus increase the amount of time between pulses in synchronization signal 417, in order to allow sufficient time for the write operations needed to store A values in registers of newly-activated devices. In some implementations, synchronization signal 417 can be generated using configurable pulse generation capabilities of one of the active integrated circuit devices in system 400 (e.g., using pulse generator 640 of FIG. 6 while integrated circuit device 400-4 is active), and system controller 415 can reduce the pulse frequency $F_P$ by reconfiguring the pulse generation of that integrated circuit device. In some implementations, system controller 415 can increase the pulse frequency $F_P$ back to its previous value (e.g., by again reconfiguring the pulse generation of an integrated circuit device generating synchronization signal 417) once the pulse associated with the stored A value has occurred.

In some implementations, cooperative count controllers 410-1 to 410-4 can implement security mechanisms to safeguard against manipulation of synchronization signal 417 (e.g., intrusive attacks involving eliminating or time-shifting pulses of synchronization signal 417, and/or injecting false pulses into synchronization signal 417). For example, in some implementations, cooperative count controllers 410-1 to 410-4 can enforce security windows around the expected arrival times of pulses in synchronization signal 417. Each security window can comprise a time interval running from a specified amount Δu of time (e.g., number of system count iterations) before the expected arrival time of a given pulse to a specified amount $\Delta_{t2}$ of time after the expected arrival time of that pulse. Thus, for a pulse expected to arrive at a time t, the security window can run from a time t−$\Delta_{t1}$ to a time t+$\Delta_{t2}$. If a pulse arrives outside of the security window, a cooperative count controller detecting the pulse can report a security violation to system controller 415. A security violation can also be reported if the pulse expected to arrive during the security window does not arrive. In some implementations, the cooperative count controller can report the security violation to system controller 415 by issuing an interrupt. In some implementations, in response to detecting/receiving a report of a security violation from the cooperative count controller of a given one of integrated circuit devices 400-1 to 400-4, system controller 415 can isolate that integrated circuit device from the rest of system 400 to prevent a potential attack or malfunction.

Figure 9:
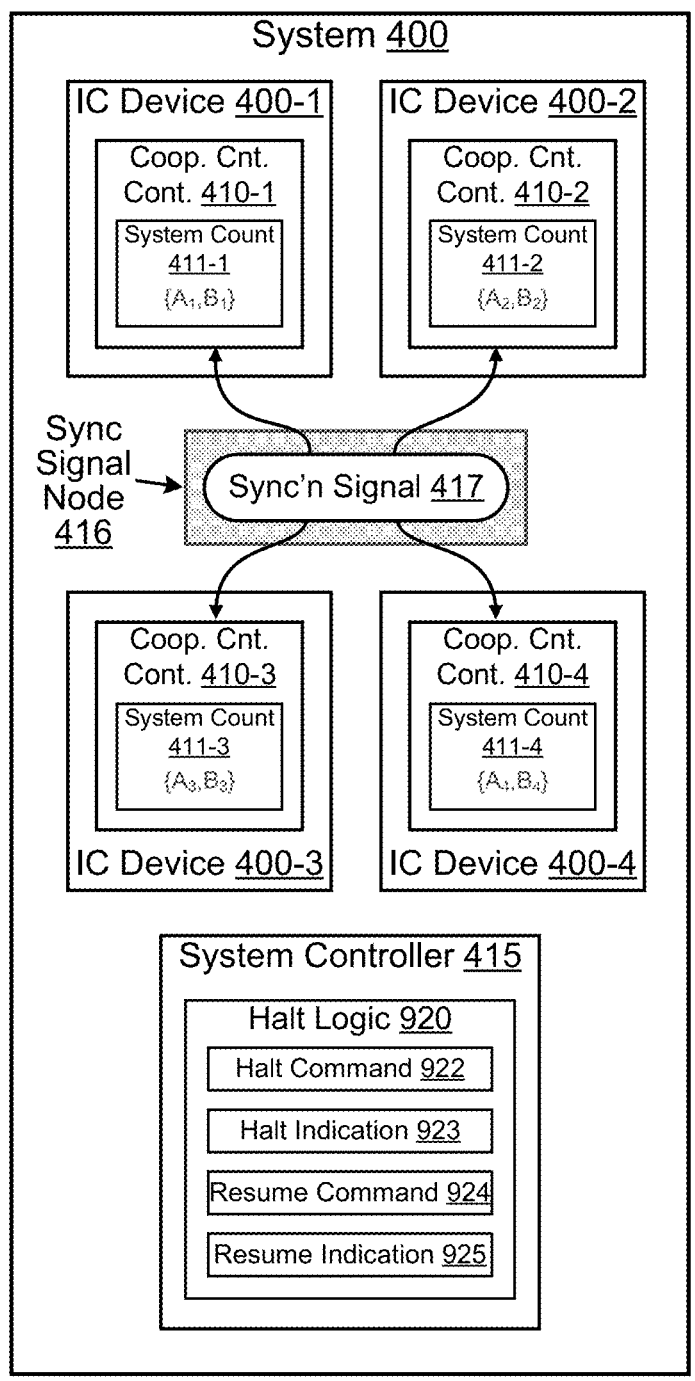
FIG. 9 illustrates an example of an operating environment.

FIG. 9 illustrates an example operating environment 900. In operating environment 900, system counts 411-1 to 411-4 are implemented using the two-part structure of system count 800 of FIG. 8, such that they each consist of a respective count A and a respective count B. Responsive to determining to initiate a system halt at system 400, system controller 415 activates halt logic 920. Halt logic 920 controls the implementation of the system halt to preserve alignment among system counts 411-1 to 411-4. In some cases, system controller 415 can determine to initiate the system halt in response to an interrupt generated by one of integrated circuit devices 400-1 to 400-4. In other cases, system controller 415 can determine to initiate the system halt in response to detecting a particular condition, such as the presence of a particular value in a particular memory location, and/or as a product of programmatic logic executing at system 400.

In conjunction with implementing the system halt, halt logic 920 can convey a halt command 922 to integrated circuit devices 400-1 to 400-4. Halt command 922 can take the form of a flag, logical bit value, command signal, or message, or can be an indication of some other form. By conveying halt command 922 to integrated circuit devices 400-1 to 400-4, halt logic 920 can cause integrated circuit devices 400-1 to 400-4 to suspend processing operations thereon.

In some implementations, in conjunction with implementing the system halt, halt logic 920 can convey a halt indication 923 to synchronization signal node 416 to cause synchronization signal node 416 to suspend generation of synchronization pulses. Halt indication 923 can be the same as halt command 922, or can be an indication of a different type/form. While the generation of synchronization pulses is suspended, cooperative count controllers 410-1 to 410-4 can continue incrementing their respective count B values. In some implementations, if the system halt—and thus the suspension of synchronization pulse generation—lasts long enough for their respective count Bs to reach their maximum possible values (e.g., such that each of the N bits is equal to 1), cooperative count controllers 410-1 to 410-4 may raise interrupts (e.g., to indicate security violations). In such implementations, the interrupts can be ignored.

In some implementations, rather than conveying halt indication 923 to synchronization signal node 416, halt logic 920 can convey halt indication 923 to cooperative count controllers 410-1 to 410-4, and synchronization signal node 416 can continue generating synchronization pulses. Responsive to receipt/detection of halt indication 923, cooperative count controllers 410-1 to 410-4 can stop incrementing their respective count B values. In some implementations, upon subsequent detection of a synchronization pulse in synchronization signal 417 while the system halt is in effect, cooperative count controllers 410-1 to 410-4 can increment their respective count A values and initialize their respective count B values (e.g., by setting their respective count B values to zero). In other implementations, cooperative count controllers 410-1 to 410-4 can ignore the subsequently-detected synchronization pulse (or refrain from attempting to detect synchronization pulses), and leave their respective count A and count B values unchanged.

In implementations in which halt logic 920 conveys halt indication 923 to cooperative count controllers 410-1 to 410-4, halt indication 923 may not necessarily reach each of cooperative count controllers 410-1 to 410-4 simultaneously. In many cases, halt indication 923 may take longer to reach some of cooperative count controllers 410-1 to 410-4 than it takes to reach others among cooperative count controllers 410-1 to 410-4. If halt indication 923 is issued just before a pulse P occurs in synchronization signal 417, it may be possible for halt indication 923 to reach some of cooperative count controllers 410-1 to 410-4 prior to the pulse P, but not reach others among cooperative count controllers 410-1 to 410-4 until after the pulse P.

Devices that receive halt indication 923 prior to the pulse P may regard pulse P as the first pulse following the start of the system halt, while devices that receive halt indication 923 after pulse P may regard a next pulse P' as the first pulse following the start of the system halt. The behavior of the former and latter devices may differ on this basis, potentially giving rise to a mismatch among the respective count A values of system counts 411-1 to 411-4. In implementations in which cooperative count controllers 410-1 to 410-4 ignore (or refrain from attempting to detect) synchronization pulses following suspension of the incrementation of their count B values, some count A values may be incremented in response to pulse P, while others are not. Similarly, in implementations in which cooperative count controllers 410-1 to 410-4 increment their count A values upon detecting a synchronization pulse subsequent to suspending incrementation of their count B values, some count A values may be incremented in response to pulse P and incremented again in response to pulse P', while others are only incremented in response to pulse P and are not incremented in response to pulse P'.

In some implementations, in order to avoid creating a mismatch between the count A values—and thus the system timings—of integrated circuit devices 400-1 to 400-4, halt logic 920 can convey halt indications such as halt indication 923 during halt indication safe zones. With respect to any given synchronization pulse in synchronization signal 417, the halt indication safe zone can be defined as a time interval during which, if halt logic 920 generates a halt indication, that halt indication will reach each of cooperative count controllers 410-1 to 410-4 prior to that synchronization pulse.

In some implementations, following a determination to convey halt indication 923 to cooperative count controllers 410-1 to 410-4, halt logic 920 can determine whether the current system time falls within a halt indication safe zone for a next synchronization pulse. In some implementations, halt logic 920 can determine whether the current system time falls within the halt indication safe zone for the next synchronization pulse by determining an amount of time remaining until the next synchronization pulse, and comparing that amount of time to a threshold. If the amount of time remaining until the next synchronization pulse is greater than the threshold, halt logic 920 can determine that the current system time falls within the halt indication safe zone for the next synchronization pulse, and can proceed with conveying halt indication 923 to cooperative count controllers 410-1 to 410-4 without delay. If the amount of time remaining until the next synchronization pulse is less than the threshold, halt logic 920 can determine that the current system time does not fall within the halt indication safe zone for the next synchronization pulse, and can identify a subsequent point in time that falls within a halt indication safe zone for a following synchronization pulse and wait until that subsequent point in time to convey halt indication 923 to cooperative count controllers 410-1 to 410-4. By conveying halt indications during halt indication safe zones in this fashion, halt logic 920 can ensure that the halt indications reach each of cooperative count controllers 410-1 to 410-4 during same inter-pulse intervals, so that mismatches between count A values are not created.

At some point in time subsequent to implementation of a system halt, system controller 415 may determine to release the system halt (and thereby to cause integrated circuit devices 400-1 to 400-4 to resume processing operations thereon), and halt logic 920 can manage the release of the system halt to preserve alignment among system counts 411-1 to 411-4. In some cases, system controller 415 can determine to release the system halt in response to resolution of an interrupt that was the basis for implementing the system halt. In other cases, system controller 415 can determine to release the system halt in response to detecting a particular condition, such as the presence of a particular value in a particular memory location, and/or as a product of programmatic logic executing at system 400.

In conjunction with releasing the system halt, halt logic 920 can convey a resume command 924 to integrated circuit devices 400-1 to 400-4. Resume command 924 can take the form of a flag, logical bit value, command, or message, or can be an indication of some other form. By conveying resume command 924 to integrated circuit devices 400-1 to 400-4, halt logic 920 can cause integrated circuit devices 400-1 to 400-4 to resume processing operations thereon.

In implementations in which halt logic 920 conveys halt indication 923 to synchronization signal node 416 to cause synchronization signal node 416 to suspend generation of synchronization pulses in conjunction with implementing the system halt, halt logic 920 can convey a resume indication 925 to synchronization signal node 416 in conjunction with releasing the system halt. Resume indication 925 can be the same as resume command 924, or can be an indication of a different type/form. Responsive to resume indication 925, synchronization signal node 416 can resume synchronization pulse generation. Based on receipt/detection of a synchronization pulse in synchronization signal 417 once synchronization signal node 416 has resumed synchronization pulse generation, cooperative count controllers 410-1 to 410-4 can increment their respective count A values and initialize their respective count B values (e.g., by setting their respective count B values to zero).

In implementations in which halt logic 920 conveys halt indication 923 to cooperative count controllers 410-1 to 410-4 in conjunction with implementing the system halt, halt logic 920 can convey resume indication 925 to cooperative count controllers 410-1 to 410-4 in conjunction with releasing the system halt. Responsive to receipt/detection of resume indication 925, cooperative count controllers 410-1 to 410-4 can resume incrementing their respective count B values. Upon subsequent detection of a synchronization pulse in synchronization signal 417, cooperative count controllers 410-1 to 410-4 can increment their respective count A values and initialize their respective count B values (e.g., by setting their respective count B values to zero).

Like halt indication 923, resume indication 925 may take longer to reach some of cooperative count controllers 410-1 to 410-4 than it takes to reach others, and if resume indication 925 is issued just before a given pulse, it may reach some of cooperative count controllers 410-1 to 410-4 prior to the pulse but not reach others among cooperative count controllers 410-1 to 410-4 until after that pulse. In order to avoid the count A value mismatches that can potentially result in such scenarios, in implementations in which halt logic conveys resume indications such as resume indication 925 to cooperative count controllers 410-1 to 410-4, it can do so during resume indication safe zones. With respect to any given synchronization pulse in synchronization signal 417, the resume indication safe zone can be defined as a time interval during which, if halt logic 920 generates a resume indication for conveyance to cooperative count controllers 410-1 to 410-4, that resume indication will reach each of cooperative count controllers 410-1 to 410-4 prior to that synchronization pulse.

In some implementations, following a determination to convey resume indication 925 to cooperative count controllers 410-1 to 410-4, halt logic 920 can determine whether the current system time falls within a resume indication safe zone for a next synchronization pulse. In some implementations, halt logic 920 can determine whether the current system time falls within the resume indication safe zone for the next synchronization pulse by determining an amount of time remaining until the next synchronization pulse, and comparing that amount of time to a threshold. If the amount of time remaining until the next synchronization pulse is greater than the threshold, halt logic 920 can determine that the current system time falls within the resume indication safe zone for the next synchronization pulse, and can proceed with conveying resume indication 925 to cooperative count controllers 410-1 to 410-4 without delay. If the amount of time remaining until the next synchronization pulse is less than the threshold, halt logic 920 can determine that the current system time does not fall within the resume indication safe zone for the next synchronization pulse, and can identify a subsequent point in time that falls within a resume indication safe zone for a following synchronization pulse, and wait until that subsequent point in time to convey resume indication 925 to cooperative count controllers 410-1 to 410-4. By conveying resume indications during resume indication safe zones in this fashion, halt logic 920 can ensure that the resume indications reach each of cooperative count controllers 410-1 to 410-4 during same inter-pulse intervals, so that mismatches between count A values are not created.

Figure 10:
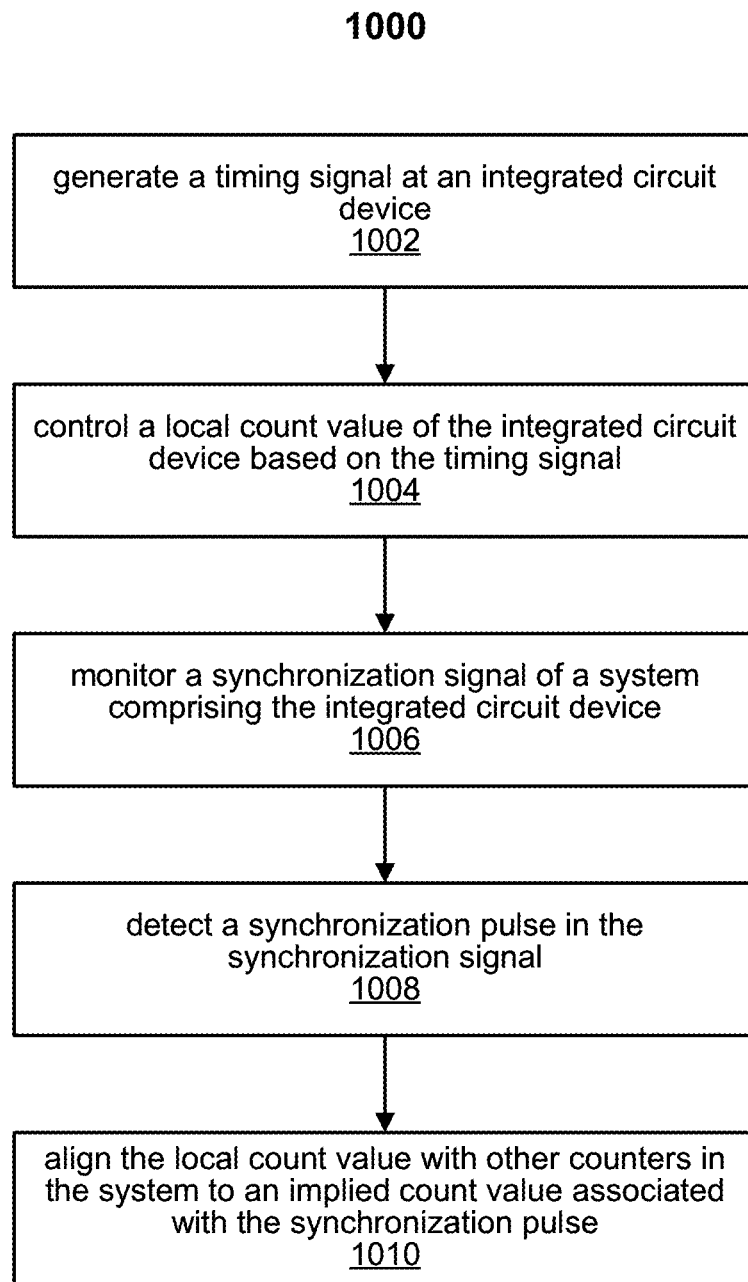
FIG. 10 illustrates an example of a first process.

FIG. 10 includes a flowchart illustrating an example of a process 1000 for cooperative timing alignment. These methods may be implemented by the systems described above, such as for example system 400, 500, 550, and/or 600. At step 1002, the process 1000 includes generating a timing signal at an integrated circuit device. For example, a PLL of cooperative count controller 410-1 can accept a lower-frequency reference signal and frequency-multiply it to produce a higher-frequency output signal that serves as a timing signal. At step 1004, the process 1000 includes controlling a local count value of the integrated circuit device based on the timing signal. For example, cooperative count controller 410-1 can control system count 411-1 based on the timing signal generated at 1002. In some implementations, for instance, cooperative count controller 410-1 can increment system count 411-1 each time it detects a rising edge (or falling edge), peak, or other cyclic feature in the timing signal. At step 1006, the process 1000 includes monitoring a synchronization signal of a system comprising the integrated circuit device. For example, cooperative count controller 410-1 can monitor synchronization signal 417 of system 400. In conjunction with monitoring the synchronization signal at 1006, cooperative count controller 410-1 can use signal processing techniques to check for the presence of synchronization pulses in the synchronization signal.

At step 1008, the process 1000 includes detecting a synchronization pulse in the synchronization signal. For example, cooperative count controller 410-1 can detect a synchronization pulse in synchronization signal 417 of system 400, e.g. by detecting a rising edge (or falling edge), peak, or other cyclic feature in the synchronization signal. At step 1010, the process 1000 includes aligning the local count value with other counters in the system (e.g., counters in other integrated circuit devices) to an implied count value associated with the synchronization pulse. For example, cooperative count controller 410-1 can align system count 411-1 with an implied count value associated with the synchronization pulse detected at 1008.

In some implementations, the implied count value associated with the synchronization pulse can be determined prior to the detection of the synchronization pulse at 1008. In some implementations, the implied count value can be determined by adding a counts-per-pulse value to an implied count value associated with a preceding synchronization pulse of the synchronization signal. In some implementations, the counts-per-pulse value can represent a ratio $I_P$ between a common count frequency $F_C$ of the system and a pulse frequency $F_P$ of the synchronization signal.

In some implementations, upon detection of the synchronization pulse, the local count value can be set to match the implied count value in order to align the local count value with the implied count value. In some implementations, if it is determined, prior to the detection of the synchronization pulse at 1008, that the local count value has already reached the implied count value, periodic incrementation of the local count value can be paused. In such implementations, the periodic incrementation of the local count value can be resumed upon detection of the synchronization pulse.

Figure 11:
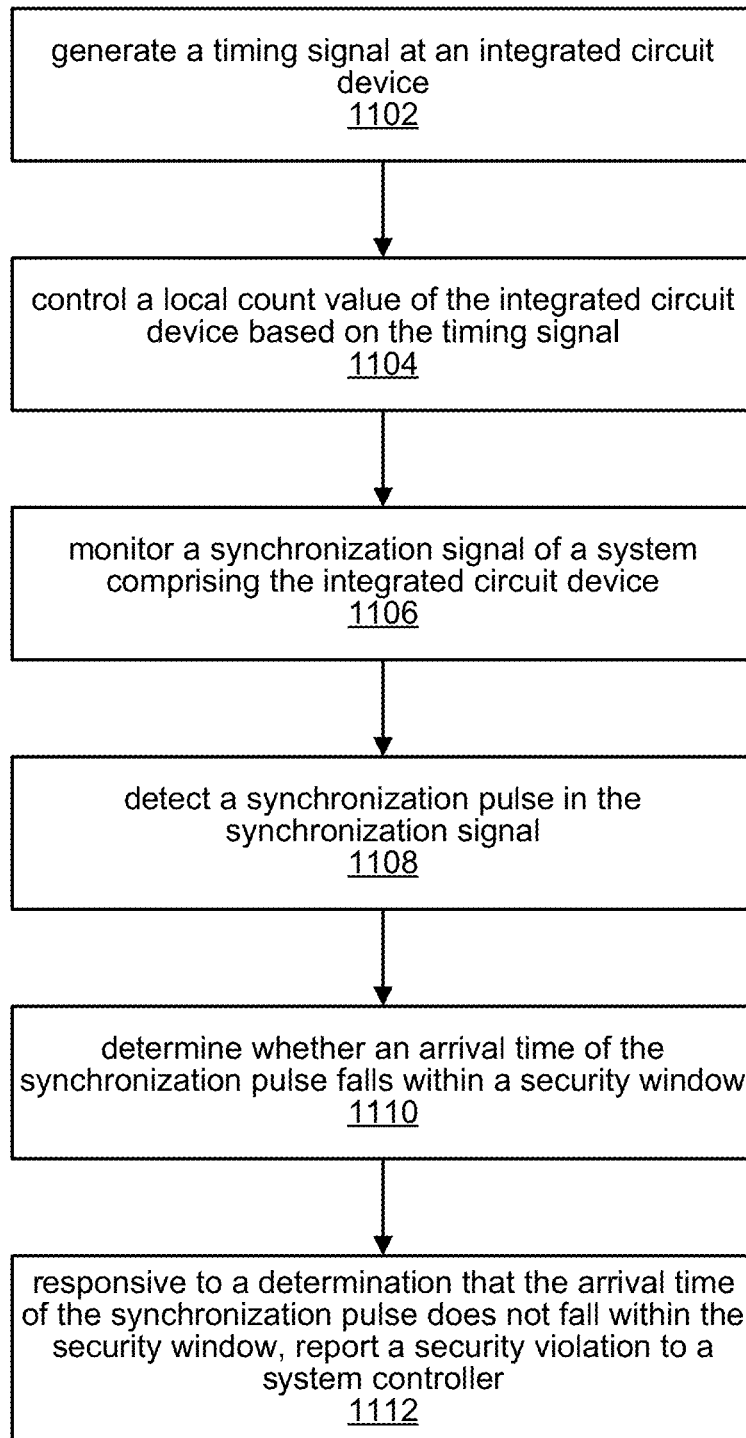
FIG. 11 illustrates an example of a second process.

FIG. 11 includes a flowchart illustrating an example of a process 1100 for cooperative timing alignment. These methods may be implemented by the systems described above, such as for example system 400, 500, 550, and/or 600. At step 1102, the process 1100 includes generating a timing signal at an integrated circuit device. For example, a PLL of cooperative count controller 410-1 can accept a lower-frequency reference signal and frequency-multiply it to produce a higher-frequency output signal that serves as a timing signal. At step 1104, the process 1100 includes controlling a local count value of the integrated circuit device based on the timing signal. For example, cooperative count controller 410-1 can control system count 411-1 based on the timing signal generated at 1102. In some implementations, for instance, cooperative count controller 410-1 can increment system count 411-1 each time it detects a rising edge (or falling edge), peak, or other cyclic feature in the timing signal. At step 1106, the process 1100 includes monitoring a synchronization signal of a system comprising the integrated circuit device. For example, cooperative count controller 410-1 can monitor synchronization signal 417 of system 400. In conjunction with monitoring the synchronization signal at 1106, cooperative count controller 410-1 can use signal processing techniques to check for the presence of synchronization pulses in the synchronization signal.

In some implementations, a security window can be determined based on an expected pulse arrival time associated with a next expected synchronization pulse. In some implementations, the expected pulse arrival time can be determined based on an arrival time of a previously-detected synchronization pulse. In some implementations, the expected pulse arrival time can be determined based on a common count frequency $F_C$ of the system and a pulse frequency Fr of the synchronization signal. In some implementations, a counts-per-pulse value $I_P$ can be determined as a ratio between the common count frequency $F_C$ and the pulse frequency $F_P$, and the expected pulse arrival time can be determined by adding the counts-per-pulse value $I_P$ to the arrival time of the previously-detected synchronization pulse.

In some implementations, a start time of the security window can be determined by subtracting a first time margin from the expected pulse arrival time. In some implementations, an end time of the security window can be determined by adding a second time margin to the expected pulse arrival time. The first and second time margins can be the same in some implementations, and can differ in other implementations.

At step 1108, the process 1100 includes detecting a synchronization pulse in the synchronization signal. For example, cooperative count controller 410-1 can detect a synchronization pulse in synchronization signal 417 of system 400, e.g. by detecting a rising edge (or falling edge), peak, or other cyclic feature in the synchronization signal. At step 1110, the process 1100 includes determining whether an arrival time of the synchronization pulse falls within the security window. For example, cooperative count controller 410-1 can determine whether an arrival time of a synchronization pulse detected at 1108 falls within the security window. At step 1112, the process 1100 includes, responsive to a determination that the arrival time of the synchronization pulse does not fall within the security window, reporting a security violation to a system controller. For example, responsive to a determination at 1110 that the arrival time of the synchronization pulse detected at 1108 does not fall within the security window, cooperative count controller 410-1 can report a security violation to system controller 415. In some implementations, an interrupt can be triggered in order to report the security violation to the system controller. In some implementations, the system controller can deactivate the integrated circuit device in response to the reporting of the security violation.

Figure 12:
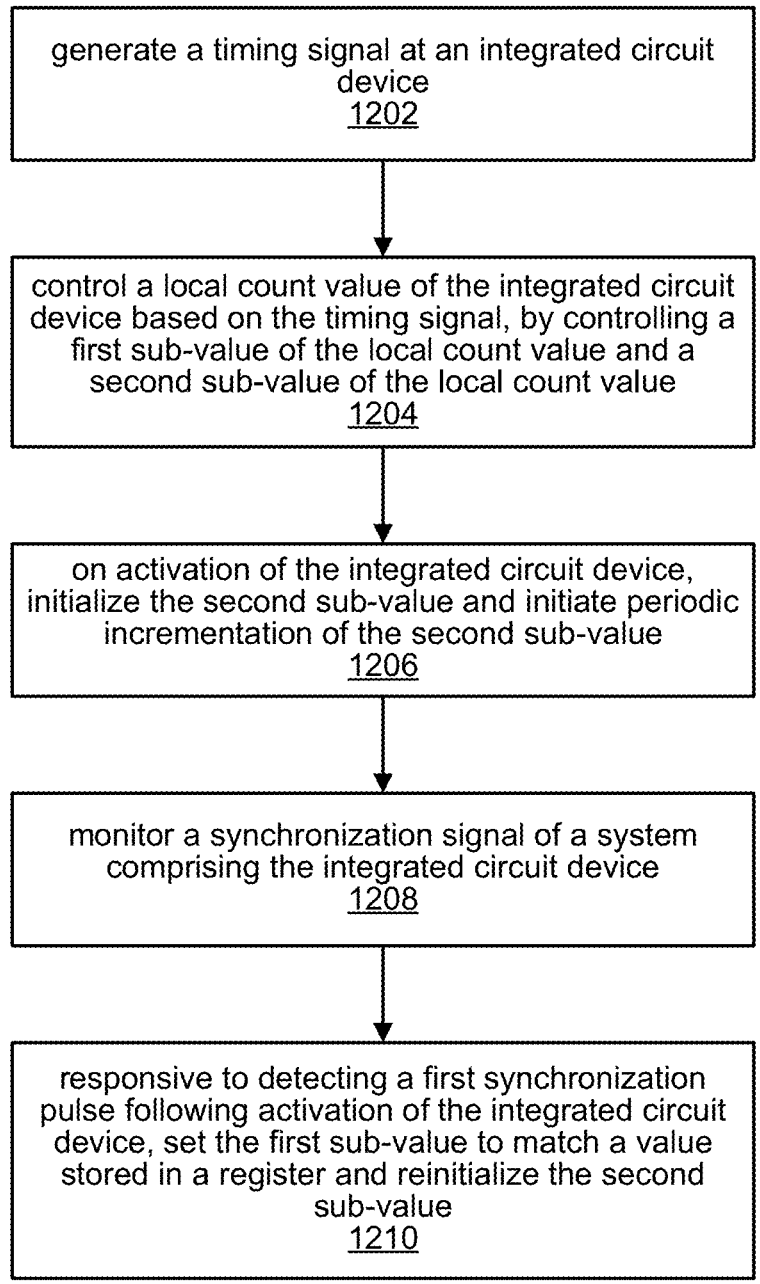
FIG. 12 illustrates an example of a third process.

FIG. 12 includes a flowchart illustrating an example of a process 1200 for cooperative timing alignment. These methods may be implemented by the systems described above, such as for example system 400, 500, 550, and/or 600. At step 1202, the process 1200 includes generating a timing signal at an integrated circuit device. For example, a PLL of cooperative count controller 410-1 can accept a lower-frequency reference signal and frequency-multiply it to produce a higher-frequency output signal that serves as a timing signal.

At step 1204, the process 1200 includes controlling a local count value of the integrated circuit device based on the timing signal, by controlling a first sub-value of the local count value and a second sub-value of the local count value. For example, system count 411-1 can be subdivided into a count A and a count B, as illustrated in reference to system count 800 of FIG. 8, and cooperative count controller 410-1 can control system count 411-1 by controlling the count A and count B values.

At step 1206, the process 1200 includes, on activation of the integrated circuit device, initializing the second sub-value and initiating periodic incrementation of the second sub-value. For example, on activation of integrated circuit device 400-1, cooperative count controller 410-1 can initialize a count B value within system count 411-1 to zero, and can initiate periodic incrementation of that count B value. In some implementations, the first sub-value can be initialized (to zero, or to another value) on activation of integrated circuit device 400-1. At step 1208, the process 1200 includes monitoring a synchronization signal of a system comprising the integrated circuit device. For example, cooperative count controller 410-1 can monitor synchronization signal 417. In some implementations, the value of a ratio $I_P$ between a common count frequency $F_C$ of the system and a pulse frequency $F_P$ of the synchronization signal can be equal to 2 N, where N is the number of bits comprised in the second sub-value. In some implementations, the local count value can comprise X bits, the second sub-value can comprise the N least significant bits of the local count value, and the first sub-value can comprise the X-N most significant bits of the local count value.

At step 1210, the process 1200 includes, responsive to detecting a synchronization pulse following activation of the integrated circuit device, setting the first sub-value to match a value stored in a register and resetting the second sub-value. For example, responsive to detecting a synchronization pulse in synchronization signal 417 following activation of integrated circuit device 400-1, cooperative count controller 410-1 can set a count A value within system count 411-1 to match a value stored in a register by integrated circuit device 400-2, and can reset a count B value within system count 411-1 to zero. In some implementations, the value in the register can be written to the register by another integrated circuit device of the system. In some implementations, by setting the first sub-value to match the value stored in the register and resetting the second sub-value, the local count value can be aligned with an implied count value associated with the synchronization pulse. In some implementations, the integrated circuit device can be one of a plurality of integrated circuit devices of the system, and the implied count value can be a common count value with which the plurality of integrated circuit devices align their respective local count values.

Figure 13:
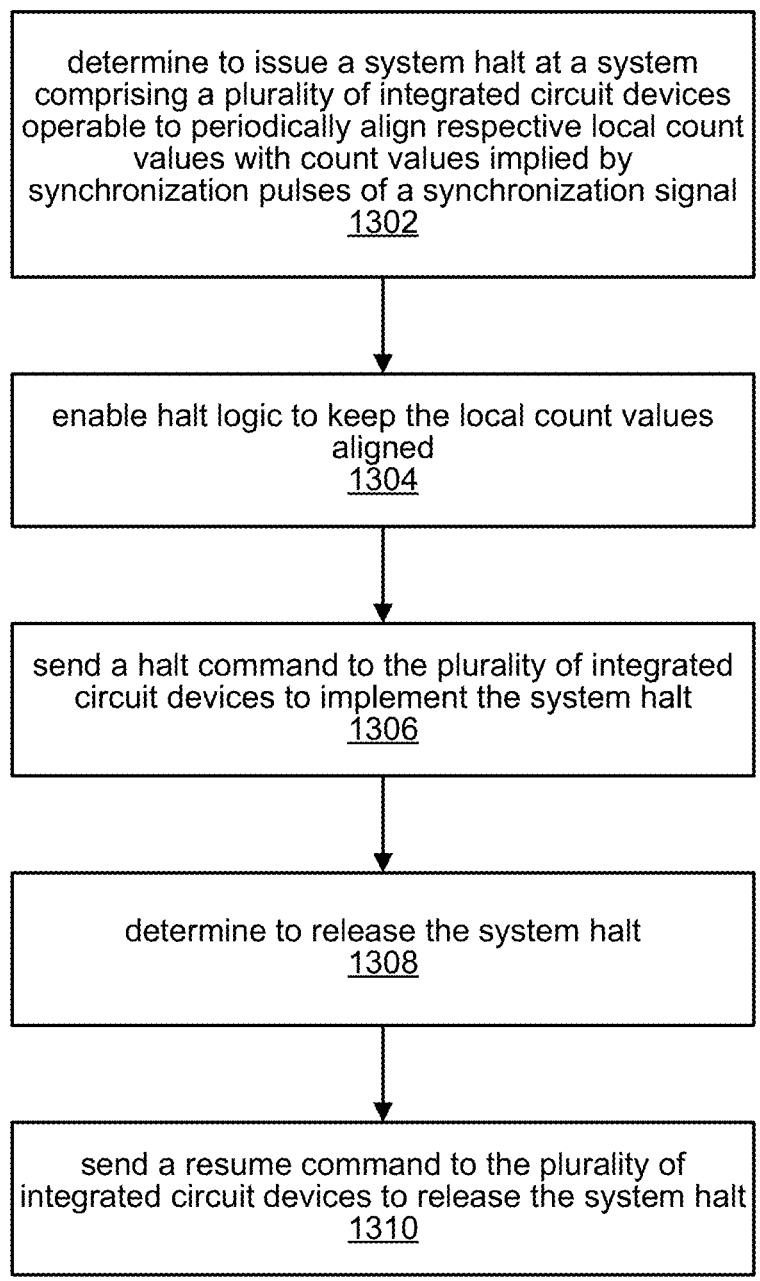
FIG. 13 illustrates an example of a fourth process.

FIG. 13 includes a flowchart illustrating an example of a process 1300 for cooperative timing alignment. These methods may be implemented by the systems described above, such as for example system 400, 500, 550, and/or 600.

At step 1302, the process 1300 includes determining to issue a system halt at a system comprising a plurality of integrated circuit devices operable to periodically align respective local count values with count values implied by synchronization pulses of a synchronization signal. For example, system controller 415 can determine to issue a system halt at system 400, which can comprise a plurality of integrated circuit devices 400-1 to 400-4 operable to periodically align respective system counts 411-1 to 411-4 with count values implied by synchronization pulses of synchronization signal 417. In some implementations, the determination to issue the system halt can be made in response to an interrupt generated by one of the plurality of integrated circuit devices. In some implementations, the determination to issue the system halt can be made in response to detecting a particular condition, such as the presence of a particular value in a particular memory location, and/or as a product of programmatic logic executing at the system.

At step 1304, the process 1300 includes enabling halt logic to keep the local count values aligned. For example, system controller 415 can enable halt logic 920, which can control the implementation of the system halt to keep system counts 411-1 to 411-4 aligned. At step 1306, the process 1300 includes sending a halt command to the plurality of integrated circuit devices to implement the system halt. For example, halt logic 920 can send halt command 922 to integrated circuit devices 400-1 to 400-4 to implement the system halt. In some implementations, sending the halt command to the plurality of integrated circuit devices can cause the plurality of integrated circuit devices to suspend processing operations.

At step 1308, the process 1300 includes determining to release the system halt. For example, system controller 415 can determine to release the system halt that it determined to issue at 1302. In some implementations, the determination to release the system halt can be made in response to resolution of an interrupt that was the basis for issuing the system halt. In some implementations, the determination to release the system halt can be made in response to detecting a particular condition, such as the presence of a particular value in a particular memory location, and/or as a product of programmatic logic executing at the system.

At step 1310, the process 1300 includes sending a resume command to the plurality of integrated circuit devices to release the system halt. For example, halt logic 920 can send resume command 924 to integrated circuit devices 400-1 to 400-4 to release the system halt. In some implementations, sending the resume command to the plurality of integrated circuit devices can cause the plurality of integrated circuit devices to resume processing operations.

Figure 14:
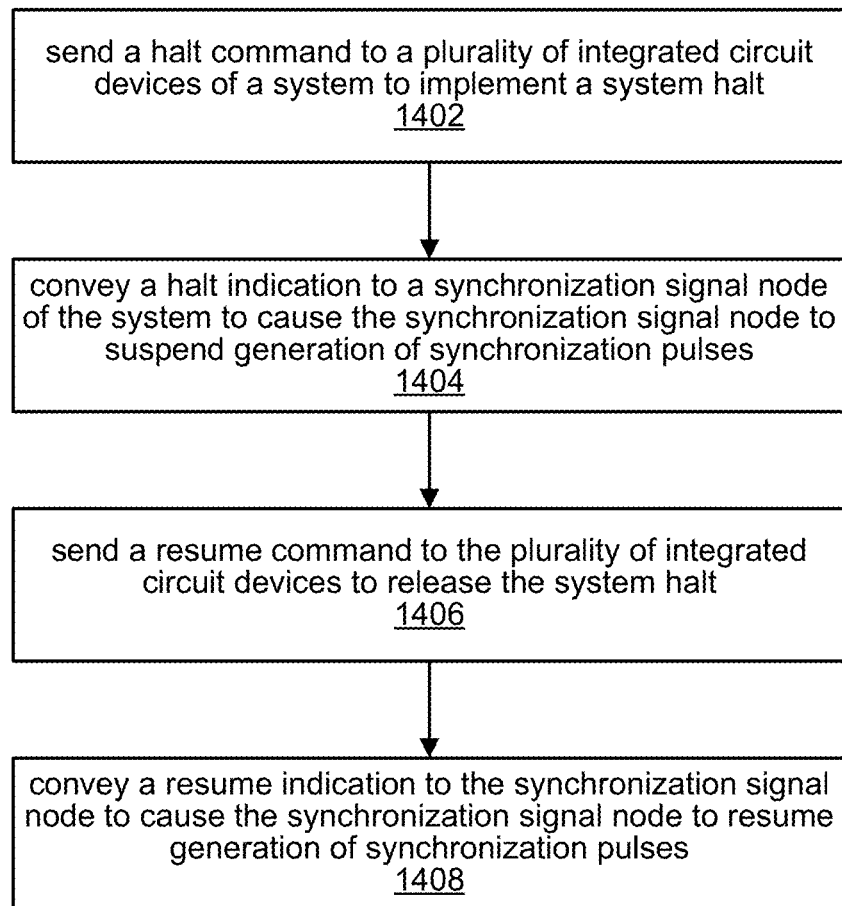
FIG. 14 illustrates an example of a fifth process.

FIG. 14 includes a flowchart illustrating an example of a process 1400 for cooperative timing alignment. Process 1400 may be representative of operations performed by system controller 415 using halt logic 920 in some implementations in which synchronization pulse generation is suspended in conjunction with implementing a system halt.

At step 1402, the process 1400 includes sending a halt command to a plurality of integrated circuit devices of a system to implement a system halt. For example, halt logic 920 can send halt command 922 to integrated circuit devices 400-1 to 400-4 to implement a system halt. In some implementations, sending the halt command to the plurality of integrated circuit devices can cause the plurality of integrated circuit devices to suspend processing operations.

At step 1404, the process 1400 includes conveying a halt indication to a synchronization signal node of the system to cause the synchronization signal node to suspend generation of synchronization pulses. For example. halt logic 920 can convey halt indication 923 to synchronization signal node 416 to cause synchronization signal node 416 to suspend transmission of synchronization pulses in synchronization signal 417. In some implementations, the halt command sent at 1402 can serve as the halt indication conveyed at 1404. In other implementations, the halt indication conveyed at 1404 can be an indication of a different type/form than the halt command sent at 1402.

In some implementations, while the generation of synchronization pulses is suspended, count controllers of the integrated circuit devices can continue incrementing their local count values. In implementations in which those local count values comprise count A and count B values, the count controllers can continue incrementing their count B values. In some implementations, the count controllers may raise interrupts if their count B values reach their maximum possible values (e.g., such that each of the N bits is equal to 1). In some implementations, those interrupts can be ignored.

At step 1406, the process 1400 includes sending a resume command to the plurality of integrated circuit devices to release the system halt. For example, halt logic 920 can send resume command 924 to integrated circuit devices 400-1 to 400-4 to release the system halt. In some implementations, sending the resume command to the plurality of integrated circuit devices can cause the plurality of integrated circuit devices to resume processing operations.

At step 1408, the process 1400 includes conveying a resume indication to the synchronization signal node to cause the synchronization signal node to resume generation of synchronization pulses. For example. halt logic 920 can convey resume indication 925 to synchronization signal node 416 to cause synchronization signal node 416 to resume transmission of synchronization pulses in synchronization signal 417. In some implementations, the resume command sent at 1406 can serve as the resume indication conveyed at 1408. In other implementations, the resume indication conveyed at 1408 can be an indication of a different type/form than the resume command sent at 1406. In some implementations, based on receipt/detection of a synchronization pulse once the synchronization signal node has resumed synchronization pulse generation, count controllers of the integrated circuit devices can increment their respective count A values and initialize their respective count B values (e.g., by setting their respective count B values to zero).

Figure 15:
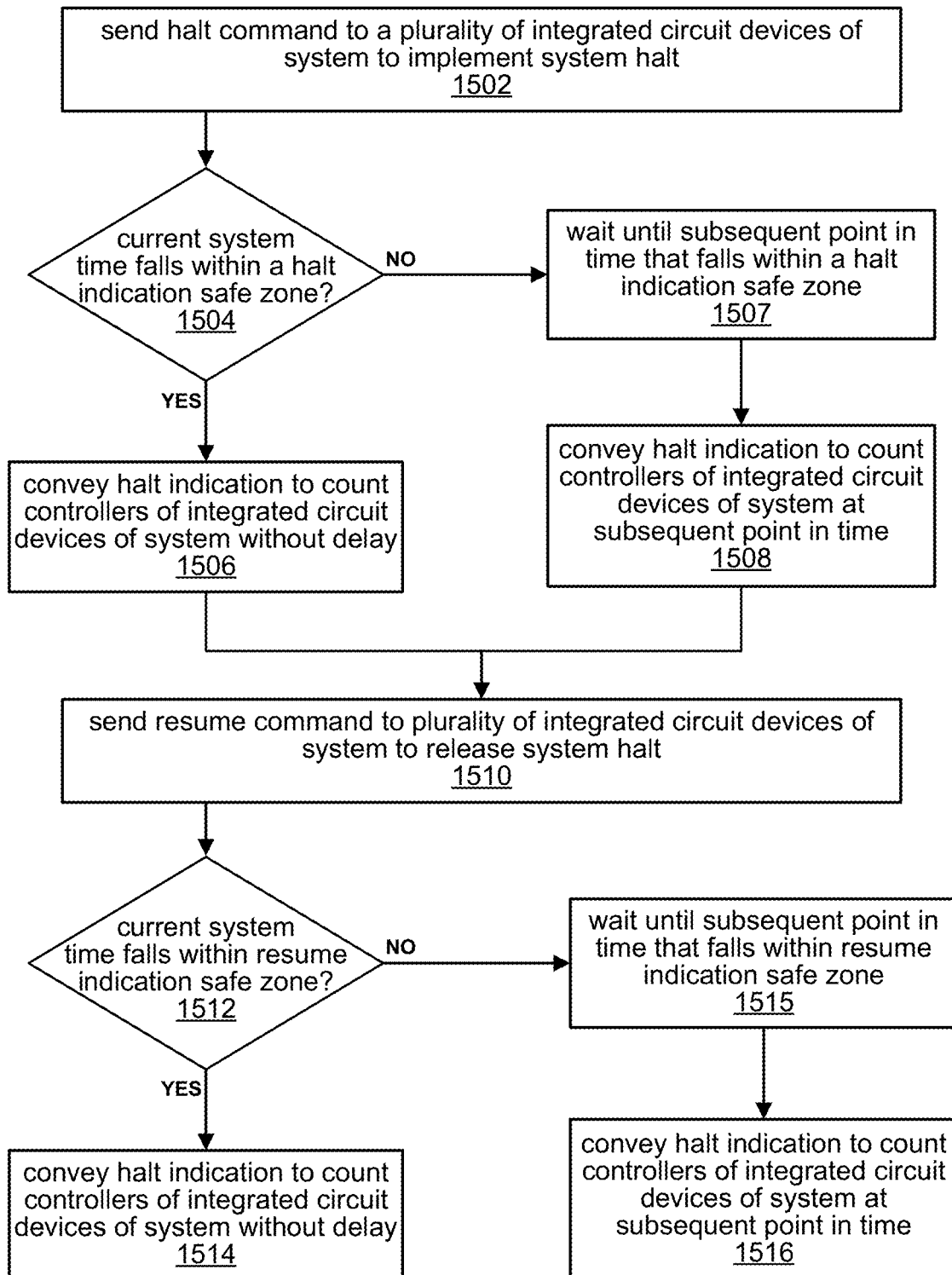
FIG. 15 illustrates an example of a sixth process.

FIG. 15 includes a flowchart illustrating an example of a process 1500 for cooperative timing alignment. Process 1500 may be representative of operations performed by system controller 415 using halt logic 920 in some implementations in which system count incrementation (on the part of cooperative count controllers 410-1 to 410-4) is suspended in conjunction with implementing a system halt.

At step 1502, the process 1500 includes sending a halt command to a plurality of integrated circuit devices of a system to implement a system halt. For example, halt logic 920 can send halt command 922 to integrated circuit devices 400-1 to 400-4 of system 400 to implement a system halt. From step 1502, flow can pass to step 1504.

At step 1504, the process 1500 includes determining whether a current system time falls within a halt indication safe zone associated with a next synchronization pulse. For example, halt logic 920 can determine whether a current system time falls within a halt indication safe zone associated with a next synchronization pulse of synchronization signal 417.

In some implementations, the determination of whether the current system time falls within the halt indication safe zone associated with the next synchronization pulse can be made based on a determination of whether a halt indication, if conveyed without delay, will propagate to each of the integrated circuit devices prior to an expected arrival time of the next synchronization pulse. In some implementations, the expected arrival time of the next synchronization pulse can be determined based on an arrival time of a previously-detected synchronization pulse. In some implementations, the expected arrival time of the next synchronization pulse can be determined by adding a counts-per-pulse value $I_P$ to the arrival time of the previously-detected synchronization pulse. In some implementations, the counts-per-pulse value $I_P$ can be determined as a ratio between a common count frequency $F_C$ of the system and a pulse frequency $F_P$ of the synchronization signal. In some implementations, an expected time of completion of propagation of the halt indication can be determined based on the current system time and an expected amount of time needed for the halt indication to reach each of the plurality integrated circuit devices. In some implementations, the expected time of completion of propagation of the halt indication can be compared to the expected arrival time of the next synchronization pulse in order to determine whether the current system time falls within the halt indication safe zone associated with the next synchronization pulse.

If it is determined at step 1504 that the current system time falls within the halt indication safe zone associated with the next synchronization pulse, flow can pass to step 1506. At step 1506, the process 1500 includes conveying a halt indication to count controllers of the plurality of integrated circuit devices without delay. For example, upon determining that the current system time falls within the halt indication safe zone associated with the next synchronization pulse of synchronization signal 417, halt logic 920 can convey halt indication 923 to cooperative count controllers 410-1 to 410-4 without delay.

If it is determined at step 1504 that the current system time does not fall within the halt indication safe zone associated with the next synchronization pulse, flow can pass to step 1507. At step 1507, the process 1500 includes waiting until subsequent point in time that falls within a halt indication safe zone associated with a subsequent synchronization pulse. For example, halt logic 920 can wait until a subsequent point in time that falls within a halt indication safe zone associated with a subsequent synchronization pulse of synchronization signal 417. In some implementations, an expected time of completion of propagation of the halt indication (if conveyed at the subsequent point in time) can be determined and compared to an expected arrival time of the subsequent synchronization pulse to confirm that the subsequent point in time falls within the halt indication safe zone associated with the subsequent synchronization pulse.

From step 1507, flow can pass to step 1508. At step 1508, the process 1500 includes conveying the halt indication to the count controllers of the plurality of integrated circuit devices at the subsequent point in time. For example, halt logic 920 can convey halt indication 923 to cooperative count controllers 410-1 to 410-4 at the subsequent point in time.

In some implementations, responsive to receipt/detection of the halt indication conveyed at either 1506 or 1508, the count controllers of the plurality of integrated circuit devices can stop incrementing their respective count B values. In some implementations, upon subsequent detection of a synchronization pulse in the synchronization signal while the system halt is in effect, the count controllers can increment their respective count A values and initialize their respective count B values (e.g., by setting their respective count B values to zero). In other implementations, the count controllers can ignore the subsequently-detected synchronization pulse (or refrain from attempting to detect synchronization pulses), and leave their respective count A and count B values unchanged.

From either step 1506 or step 1508, flow can pass to step 1510. At step 1510, the process 1500 includes sending a resume command to the plurality of integrated circuit devices of the system to release the system halt. For example, halt logic 920 can send resume command 924 to integrated circuit devices 400-1 to 400-4 to release the system halt. From step 1510, flow can pass to step 1512.

At step 1512, the process 1500 includes determining whether a current system time falls within a resume indication safe zone associated with a next synchronization pulse. For example, halt logic 920 can determine whether a current system time falls within a resume indication safe zone associated with a next synchronization pulse of synchronization signal 417.

In some implementations, the determination of whether the current system time falls within the resume indication safe zone associated with the next synchronization pulse can be made based on a determination of whether a resume indication, if conveyed without delay, will propagate to each of the integrated circuit devices prior to an expected arrival time of the next synchronization pulse. In some implementations, the expected arrival time of the next synchronization pulse can be determined based on an arrival time of a previously-detected synchronization pulse. In some implementations, the expected arrival time of the next synchronization pulse can be determined by adding a counts-per-pulse value $I_P$ to the arrival time of the previously-detected synchronization pulse. In some implementations, the counts-per-pulse value $I_P$ can be determined as a ratio between a common count frequency $F_C$ of the system and a pulse frequency $F_P$ of the synchronization signal. In some implementations, an expected time of completion of propagation of the resume indication can be determined based on the current system time and an expected amount of time needed for the resume indication to reach each of the plurality integrated circuit devices. In some implementations, the expected time of completion of propagation of the resume indication can be compared to the expected arrival time of the next synchronization pulse in order to determine whether the current system time falls within the resume indication safe zone associated with the next synchronization pulse.

If it is determined at step 1512 that the current system time falls within the resume indication safe zone associated with the next synchronization pulse, flow can pass to step 1514. At step 1514, the process 1500 includes conveying a resume indication to the count controllers of the plurality of integrated circuit devices without delay. For example, upon determining that the current system time falls within the resume indication safe zone associated with the next synchronization pulse of synchronization signal 417, halt logic 920 can convey resume indication 925 to cooperative count controllers 410-1 to 410-4 without delay.

If it is determined at step 1512 that the current system time does not fall within the resume indication safe zone associated with the next synchronization pulse, flow can pass to step 1515. At step 1515, the process 1500 includes waiting until subsequent point in time that falls within a resume indication safe zone associated with a subsequent synchronization pulse. For example, halt logic 920 can wait until a subsequent point in time that falls within a resume indication safe zone associated with a subsequent synchronization pulse of synchronization signal 417. In some implementations, an expected time of completion of propagation of the resume indication (if conveyed at the subsequent point in time) can be determined and compared to an expected arrival time of the subsequent synchronization pulse to confirm that the subsequent point in time falls within the resume indication safe zone associated with the subsequent synchronization pulse.

From step 1515, flow can pass to step 1516. At step 1516, the process 1500 includes conveying the resume indication to the count controllers of the plurality of integrated circuit devices at the subsequent point in time. For example, halt logic 920 can convey resume indication 925 to cooperative count controllers 410-1 to 410-4 at the subsequent point in time.

Figure 16:
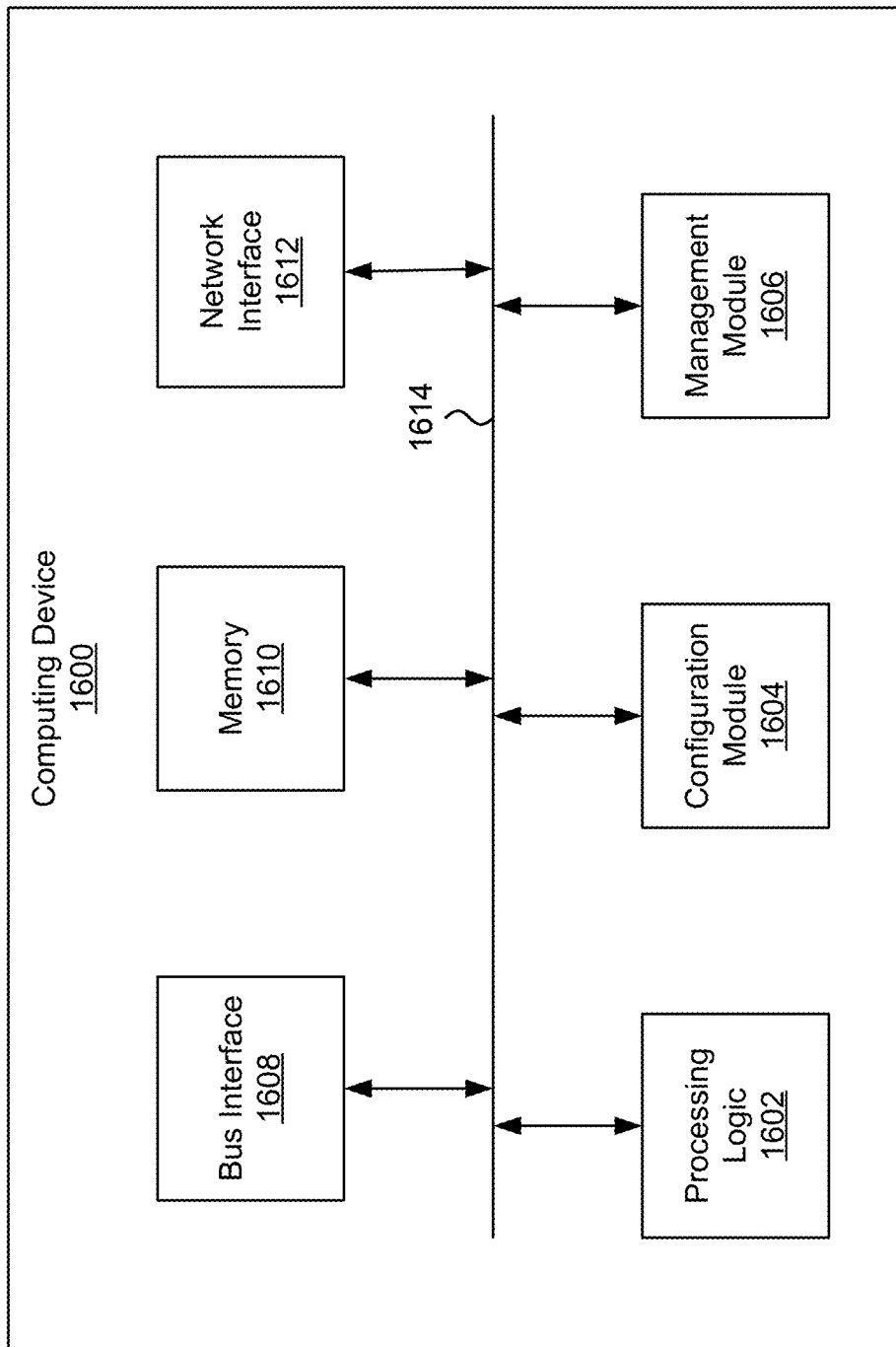
FIG. 16 illustrates an example of a computing device, according to certain aspects of the disclosure.

FIG. 16 illustrates an example of a computing device 1600. Functionality and/or several components of the computing device 1600 may be used without limitation with other embodiments disclosed elsewhere in this disclosure, without limitations. In one example, the computing device 1600 may include processing logic 1602, a configuration module 1604, a management module 1606, a bus interface module 1608, memory 1610, and a network interface module 1612. These modules may be hardware modules, software modules, or a combination of hardware and software. In certain instances, modules may be interchangeably used with components or engines, without deviating from the scope of the disclosure. The computing device 1600 may include additional modules, not illustrated here. In some implementations, the computing device 1600 may include fewer modules. In some implementations, one or more of the modules may be combined into one module. One or more of the modules may be in communication with each other over a communication channel 1614. The communication channel 1614 may include one or more busses, meshes, matrices, fabrics, a combination of these communication channels, or some other suitable communication channel.

The processing logic 1602 may include application specific integrated circuits (ASICs), field programmable gate arrays (FPGAs), systems-on-chip (SoCs), network processing units (NPUs), processors configured to execute instructions or any other circuitry configured to perform logical arithmetic and floating point operations. Examples of processors that may be included in the processing logic 1602 may include processors developed by ARM®, MIPS®, AMD®, Intel®, Qualcomm®, and the like. In certain implementations, processors may include multiple processing cores, wherein each processing core may be configured to execute instructions independently of the other processing cores. Furthermore, in certain implementations, each processor or processing core may implement multiple processing threads executing instructions on the same processor or processing core, while maintaining logical separation between the multiple processing threads. Such processing threads executing on the processor or processing core may be exposed to software as separate logical processors or processing cores. In some implementations, multiple processors, processing cores or processing threads executing on the same core may share certain resources, such as for example busses, level 1 (L1) caches, and/or level 2 (L2) caches. The instructions executed by the processing logic 1602 may be stored on a computer-readable storage medium, for example, in the form of a computer program. The computer-readable storage medium may be non-transitory. In some cases, the computer-readable medium may be part of the memory 1610.

The memory 1610 may include either volatile or non-volatile, or both volatile and non-volatile types of memory. The memory 1610 may, for example, include random access memory (RAM), read only memory (ROM), Electrically Erasable Programmable Read-Only Memory (EEPROM), flash memory, and/or some other suitable storage media. In some cases, some or all of the memory 1610 may be internal to the computing device 1600, while in other cases some or all of the memory may be external to the computing device 1600. The memory 1610 may store an operating system comprising executable instructions that, when executed by the processing logic 1602, provides the execution environment for executing instructions providing networking functionality for the computing device 1600. The memory may also store and maintain several data structures and routing tables for facilitating the functionality of the computing device 1600.

In some implementations, the configuration module 1604 may include one or more configuration registers. Configuration registers may control the operations of the computing device 1600. In some implementations, one or more bits in the configuration register can represent certain capabilities of the computing device 1600. Configuration registers may be programmed by instructions executing in the processing logic 1602, and/or by an external entity, such as a host device, an operating system executing on a host device, and/or a remote device. The configuration module 1604 may further include hardware and/or software that control the operations of the computing device 1600.

In some implementations, the management module 1606 may be configured to manage different components of the computing device 1600. In some cases, the management module 1606 may configure one or more bits in one or more configuration registers at power up, to enable or disable certain capabilities of the computing device 1600. In certain implementations, the management module 1606 may use processing resources from the processing logic 1602. In other implementations, the management module 1606 may have processing logic similar to the processing logic 1602, but segmented away or implemented on a different power plane than the processing logic 1602.

The bus interface module 1608 may enable communication with external entities, such as a host device and/or other components in a computing system, over an external communication medium. The bus interface module 1608 may include a physical interface for connecting to a cable, socket, port, or other connection to the external communication medium. The bus interface module 1608 may further include hardware and/or software to manage incoming and outgoing transactions. The bus interface module 1608 may implement a local bus protocol, such as Peripheral Component Interconnect (PCI) based protocols, Non-Volatile Memory Express (NVMe), Advanced Host Controller Interface (AHCI), Small Computer System Interface (SCSI), Serial Attached SCSI (SAS), Serial AT Attachment (SATA), Parallel ATA (PATA), some other standard bus protocol, or a proprietary bus protocol. The bus interface module 1608 may include the physical layer for any of these bus protocols, including a connector, power management, and error handling, among other things. In some implementations, the computing device 1600 may include multiple bus interface modules for communicating with multiple external entities. These multiple bus interface modules may implement the same local bus protocol, different local bus protocols, or a combination of the same and different bus protocols.

The network interface module 1612 may include hardware and/or software for communicating with a network. This network interface module 1612 may, for example, include physical connectors or physical ports for wired connection to a network, and/or antennas for wireless communication to a network. The network interface module 1612 may further include hardware and/or software configured to implement a network protocol stack. The network interface module 1612 may communicate with the network using a network protocol, such as for example TCP/IP, Infiniband, RoCE, Institute of Electrical and Electronics Engineers (IEEE) 802.11 wireless protocols, User Datagram Protocol (UDP), Asynchronous Transfer Mode (ATM), token ring, frame relay, High Level Data Link Control (HDLC), Fiber Distributed Data Interface (FDDI), and/or Point-to-Point Protocol (PPP), among others. In some implementations, the computing device 1600 may include multiple network interface modules, each configured to communicate with a different network. For example, in these implementations, the computing device 1600 may include a network interface module for communicating with a wired Ethernet network, a wireless 802.11 network, a cellular network, an Infiniband network, etc.

The various components and modules of the computing device 1600, described above, may be implemented as discrete components, as a System on a Chip (SoC), as an ASIC, as an NPU, as an FPGA, or any combination thereof. In some embodiments, the SoC or other component may be communicatively coupled to another computing system to provide various services such as traffic monitoring, traffic shaping, computing, etc. In some embodiments of the technology, the SoC or other component may include multiple subsystems.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in FIG. 16, and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A system, comprising:
    a pulse generator to generate a synchronization signal;
    a first integrated circuit device, comprising:
        a first signal generator to generate a first timing signal; and
        a first count controller to control a first local count value based on the first timing signal, the first count controller operable to:
            on startup of the first count controller, initialize the first local count value and initiate periodic incrementation of the first local count value;
            detect a synchronization pulse in the synchronization signal; and
            align the first local count value with an implied count value associated with the synchronization pulse; and
    a second integrated circuit device, comprising:
        a second signal generator to generate a second timing signal; and
        a second count controller to control a second local count value based on the second timing signal, the second count controller operable to:
            on startup of the second count controller, initialize the second local count value and initiate periodic incrementation of the second local count value;
            detect the synchronization pulse in the synchronization signal; and
            align the second local count value with the implied count value associated with the synchronization pulse.

2. The system of claim 1, wherein the first count controller is operable to control the first local count value by controlling a first sub-value of the first local count value and a second sub-value of the first local count value, and
    wherein the first local count value comprises X bits, the second sub-value comprises N least significant bits of the first local count value, and the first sub-value comprises X-N most significant bits of the first local count value.

3. The system of claim 1, wherein the pulse generator is external to the first integrated circuit device and the second integrated circuit device.

4. The system of claim 1, wherein the pulse generator is comprised in the first integrated circuit device or the second integrated circuit device.

5. An integrated circuit device, comprising:
    a signal generator to generate a timing signal; and
    a count controller to control a local count value based on the timing signal, the count controller operable to:
        monitor a synchronization signal of a system comprising the integrated circuit device;
        detect a synchronization pulse in the synchronization signal;
        determine an implied count value based on a counts-per-pulse value; and
        align the local count value with other counters in the system to the implied count value associated with the synchronization pulse.

6. The integrated circuit device of claim 5, wherein the count controller is operable to:
    prior to the detection of the synchronization pulse:
        determine that the local count value matches the implied count value associated with the synchronization pulse; and
        responsive to the determination that the local count value matches the implied count value, pause periodic incrementation of the local count value; and
    when the synchronization pulse is detected:
        align the local count value with the implied count value by resuming the periodic incrementation of the local count value.

7. The integrated circuit device of claim 5, wherein the count controller is operable to align the local count value with the implied count value by setting the local count value to match the implied count value when the synchronization pulse is detected.

8. The integrated circuit device of claim 5, wherein the count controller is operable to, on startup of the count controller:
    initialize the local count value; and after initializing the local count value, initiate periodic incrementation of the local count value.

9. The integrated circuit device of claim 5, wherein the count controller is operable to control the local count value by controlling a first sub-value of the local count value and a second sub-value of the local count value, and
wherein the local count value comprises X bits, the second sub-value comprises N least significant bits of the local count value, and the first sub-value comprises X-N most significant bits of the local count value.

10. The integrated circuit device of claim 9, wherein the count controller is operable to, in response to detecting the synchronization pulse, align the local count value with the implied count value by incrementing the first sub-value and initializing the second sub-value.

11. The integrated circuit device of claim 9, wherein a ratio between a common count frequency of the system and a pulse frequency of the synchronization signal has a value of $2^N$.

12. The integrated circuit device of claim 9, wherein the count controller is operable to, on startup of the count controller:
initialize the first sub-value;
initialize the second sub-value; and
after initializing the second sub-value, initiate periodic incrementation of the second sub-value.

13. The integrated circuit device of claim 5, wherein the counts-per-pulse value represents a ratio between:
a common count frequency of the system; and
a pulse frequency of the synchronization signal.

14. The integrated circuit device of claim 5, wherein the count controller is operable to determine the implied count value by adding the counts-per-pulse value to an implied count value associated with a preceding synchronization pulse of the synchronization signal.

15. The integrated circuit device of claim 5, wherein the system includes a volatile memory operable to perform a refresh operation based on a synchronization pulse of the synchronization signal.

16. A method, comprising:
generating, at an integrated circuit device, a timing signal;
controlling a local count value based on the timing signal;
monitoring a synchronization signal of a system comprising the integrated circuit device;
prior to detection of a synchronization pulse:
determining that the local count value matches an implied count value associated with the synchronization pulse; and
responsive to the determination that the local count value matches the implied count value, pausing periodic incrementation of the local count value;
detecting the synchronization pulse in the synchronization signal; and
when the synchronization pulse is detected:
aligning the local count value with other counters of the system to an implied count value associated with the synchronization pulse by resuming the periodic incrementation of the local count value.

17. The method of claim 16, comprising aligning the local count value with the implied count value by setting the local count value to match the implied count value following detection of the synchronization pulse.

18. The method of claim 16, wherein the system includes a volatile memory operable to perform a refresh operation based on a synchronization pulse of the synchronization signal.

* * * * *